US011715579B2

(12) United States Patent
Kim

(10) Patent No.: US 11,715,579 B2
(45) Date of Patent: Aug. 1, 2023

(54) ELECTRONIC DEVICE

(71) Applicant: Ticona LLC, Florence, KY (US)

(72) Inventor: Young Shin Kim, Cincinnati, OH (US)

(73) Assignee: Ticona LLC, Florence, KY (US)

(*) Notice: Subject to any disclaimer, the term of this patent is extended or adjusted under 35 U.S.C. 154(b) by 93 days.

(21) Appl. No.: 17/178,292

(22) Filed: Feb. 18, 2021

(65) Prior Publication Data

US 2021/0265075 A1 Aug. 26, 2021

Related U.S. Application Data

(60) Provisional application No. 63/057,345, filed on Jul. 28, 2020, provisional application No. 62/981,667, filed on Feb. 26, 2020.

(51) Int. Cl.
| | |
|---|---|
| *H01B 1/12* | (2006.01) |
| *H05K 1/09* | (2006.01) |
| *H05K 9/00* | (2006.01) |
| *H05K 3/10* | (2006.01) |

(52) U.S. Cl.
CPC ............. *H01B 1/124* (2013.01); *H05K 1/09* (2013.01); *H05K 3/101* (2013.01); *H05K 9/0083* (2013.01); *H05K 2201/0141* (2013.01); *H05K 2201/0329* (2013.01)

(58) Field of Classification Search
CPC .......... H01B 1/124; H05K 1/09; H05K 1/181; H05K 2201/0329; H05K 2201/09118; H05K 2201/0141; H05K 9/0083
See application file for complete search history.

(56) References Cited

U.S. PATENT DOCUMENTS

| | | | |
|---|---|---|---|
| 4,458,039 | A | 7/1984 | Eickman |
| 4,943,606 | A | 7/1990 | Inoue et al. |
| 5,352,746 | A | 10/1994 | Asai et al. |
| 5,375,403 | A | 12/1994 | Capote et al. |
| 5,492,946 | A | 2/1996 | Huspeni et al. |

(Continued)

FOREIGN PATENT DOCUMENTS

| | | |
|---|---|---|
| EP | 0 312 331 A2 | 4/1989 |
| EP | 0 312 331 A3 | 4/1989 |

(Continued)

OTHER PUBLICATIONS

Article—Liu et al., "Immobilization and melting point depression of imidazolium ionic liquids on the surface of nano-$SiO_x$ particles," *Dalton Trans.*, vol 39, 2010, pp. 3190-3194.

(Continued)

*Primary Examiner* — Timothy J Thompson
*Assistant Examiner* — John B Freal
(74) *Attorney, Agent, or Firm* — Dority & Manning, P.A.

(57) ABSTRACT

An electronic device is provided. The device comprises a singulated carrier portion, a substrate molded onto the singulated carrier portion, and conductive traces disposed on the substrate. The substrate comprises a polymer composition that includes an aromatic polymer and an electrically conductive filler, wherein the polymer composition exhibits a surface resistivity of from about $1 \times 10^{12}$ ohms to about $1 \times 10^{18}$ ohms as determined in accordance with ASTM D257-14.

28 Claims, 6 Drawing Sheets

(56) References Cited

U.S. PATENT DOCUMENTS

| | | |
|---|---|---|
| 5,508,374 A | 4/1996 | Lee et al. |
| 5,538,666 A | 7/1996 | Jin |
| 5,830,940 A | 11/1998 | Nakamura et al. |
| 5,847,039 A | 12/1998 | Nagashima et al. |
| 5,928,589 A | 7/1999 | Norota et al. |
| 5,962,122 A | 10/1999 | Walpita et al. |
| 5,997,765 A | 12/1999 | Furuta et al. |
| 6,010,760 A | 1/2000 | Miyazaki et al. |
| 6,046,300 A | 4/2000 | Umetsu et al. |
| 6,063,848 A | 5/2000 | Murakami et al. |
| 6,140,455 A | 10/2000 | Nagashima et al. |
| 6,153,121 A | 11/2000 | Makabe et al. |
| 6,379,795 B1 | 4/2002 | Bisaria et al. |
| 6,492,463 B1 | 12/2002 | Waggoner |
| 6,495,616 B2 | 12/2002 | Maeda |
| 6,613,847 B2 | 9/2003 | Soelch |
| 6,641,928 B2 | 11/2003 | Takeichi et al. |
| 6,680,002 B2 | 1/2004 | Yamauchi et al. |
| 6,702,955 B1 | 3/2004 | Murakami et al. |
| 6,702,956 B2 | 3/2004 | Maeda et al. |
| 6,733,691 B2 | 5/2004 | Nagano et al. |
| 6,755,992 B2 | 6/2004 | Okamoto et al. |
| 6,758,989 B2 | 7/2004 | Miyashita et al. |
| 6,797,198 B1 | 9/2004 | Miyashita et al. |
| 6,818,821 B2 | 11/2004 | Fujieda et al. |
| 6,833,405 B1 | 12/2004 | Cottis |
| 6,861,463 B2 | 3/2005 | Cottis |
| 7,079,405 B2 | 7/2006 | Tobita et al. |
| 7,166,238 B2 | 1/2007 | Kato et al. |
| 7,175,779 B1 | 2/2007 | Kricheldorf et al. |
| 7,189,778 B2 | 3/2007 | Tobita et al. |
| 7,239,261 B2 | 7/2007 | Fujieda et al. |
| 7,251,405 B2 | 7/2007 | Shelnut et al. |
| 7,276,284 B2 | 10/2007 | Frohs |
| 7,344,657 B2 | 3/2008 | Okamoto et al. |
| 7,438,832 B2 | 10/2008 | Majumdar et al. |
| 7,540,991 B2 | 6/2009 | Shimoyama et al. |
| 7,547,403 B2 | 6/2009 | Miyashita et al. |
| 7,601,771 B2 | 10/2009 | Schmidt et al. |
| 7,641,833 B2 | 1/2010 | Aoki et al. |
| 7,648,748 B2 | 1/2010 | Nakane et al. |
| 7,704,408 B2 | 4/2010 | Fukatsu |
| 7,740,770 B2 | 6/2010 | Mizumoto et al. |
| 7,789,670 B2 | 9/2010 | Fukatsu et al. |
| 7,824,572 B2 | 11/2010 | Okamoto |
| 7,825,176 B2 | 11/2010 | Kim et al. |
| 7,892,450 B2 | 2/2011 | Uchida et al. |
| 7,931,824 B2 | 4/2011 | Gin et al. |
| 7,980,897 B2 | 7/2011 | Fukatsu et al. |
| 7,985,351 B2 | 7/2011 | Yamauchi et al. |
| 8,029,694 B2 | 10/2011 | Saga |
| 8,066,907 B2 | 11/2011 | Kohinata et al. |
| 8,142,683 B2 | 3/2012 | Murouchi et al. |
| 8,192,645 B2 | 6/2012 | Murouchi et al. |
| 8,202,448 B2 | 6/2012 | Fukuhara et al. |
| 8,231,805 B2 | 7/2012 | Fukuhara et al. |
| 8,272,879 B2 | 9/2012 | Fukatsu et al. |
| 8,324,307 B2 | 12/2012 | Harder et al. |
| 8,337,719 B2 | 12/2012 | Hosoda et al. |
| 8,432,484 B2 | 4/2013 | Christison |
| 8,440,780 B2 | 5/2013 | Hamaguchi et al. |
| 8,465,670 B2 | 6/2013 | Kondo et al. |
| 8,545,719 B2 | 10/2013 | Komatsu et al. |
| 8,646,994 B2 | 2/2014 | Kim et al. |
| 8,658,057 B2 | 2/2014 | Nakayama et al. |
| 8,696,932 B2 | 4/2014 | Uchida et al. |
| 8,697,817 B2 | 4/2014 | Waggoner et al. |
| 8,778,220 B2 | 7/2014 | Lee et al. |
| 8,778,222 B2 | 7/2014 | Matsubara et al. |
| 8,778,247 B2 | 7/2014 | Stoeks et al. |
| 8,784,683 B2 | 7/2014 | Matsubara et al. |
| 8,834,741 B2 | 9/2014 | Shiraishi et al. |
| 8,906,259 B2 | 12/2014 | Kim |
| 8,926,862 B2 | 1/2015 | Kim et al. |
| 8,932,483 B2 | 1/2015 | Kim |
| 8,980,986 B2 | 3/2015 | Lee et al. |
| 9,018,315 B2 | 4/2015 | Waggoner et al. |
| 9,045,621 B2 | 6/2015 | Matsubara et al. |
| 9,045,685 B2 | 6/2015 | Nair et al. |
| 9,051,514 B2 | 6/2015 | Nair et al. |
| 9,074,070 B2 | 7/2015 | Yung et al. |
| 9,096,794 B2 | 8/2015 | Nair et al. |
| 9,103,020 B2 | 8/2015 | Gong et al. |
| 9,109,111 B2 | 8/2015 | Lee et al. |
| 9,258,892 B2 | 2/2016 | Crosley |
| 9,284,435 B2 | 3/2016 | Kim |
| 9,355,753 B2 | 5/2016 | Kim |
| 9,512,293 B2 | 12/2016 | Kim |
| 9,822,254 B2 | 11/2017 | Kim |
| 9,896,566 B2 | 2/2018 | Yung et al. |
| 9,988,519 B2 | 6/2018 | Kim |
| 10,106,682 B2 | 10/2018 | Kim |
| 10,280,282 B2 | 5/2019 | Kim |
| 10,280,332 B2 | 5/2019 | Moussa et al. |
| 10,407,605 B2 | 9/2019 | Kim et al. |
| 10,433,428 B2 | 10/2019 | Spiegel et al. |
| 10,633,535 B2 | 4/2020 | Kim |
| 10,667,407 B2 | 5/2020 | Spiegel et al. |
| 10,829,634 B2 | 11/2020 | Kim |
| 10,941,275 B2 | 3/2021 | Kim |
| 11,136,445 B2 | 10/2021 | Kim |
| 11,258,184 B2 | 2/2022 | Kim et al. |
| 2002/0064701 A1 | 5/2002 | Hand et al. |
| 2002/0190432 A1 | 12/2002 | Shiwaku et al. |
| 2005/0077498 A1 | 4/2005 | Kato et al. |
| 2005/0176835 A1 | 8/2005 | Kobayashi et al. |
| 2005/0191877 A1 | 9/2005 | Huang |
| 2005/0260361 A1 | 11/2005 | Alms et al. |
| 2006/0009580 A1 | 1/2006 | Alms et al. |
| 2006/0014876 A1 | 1/2006 | Bushelman et al. |
| 2006/0025561 A1 | 2/2006 | Watanabe et al. |
| 2007/0057236 A1 | 3/2007 | Hosoda et al. |
| 2007/0190346 A1 | 8/2007 | Ikegawa |
| 2008/0149901 A1* | 6/2008 | Choi ............... H01B 1/24 252/514 |
| 2009/0027586 A1 | 1/2009 | Kumai et al. |
| 2009/0212684 A1 | 8/2009 | Saito et al. |
| 2010/0012354 A1 | 1/2010 | Hedin et al. |
| 2011/0171452 A1 | 7/2011 | Öttinger et al. |
| 2011/0189454 A1 | 8/2011 | Fukuhara et al. |
| 2012/0135228 A1 | 5/2012 | Fukuhara et al. |
| 2012/0199790 A1 | 8/2012 | Yun et al. |
| 2013/0015411 A1 | 1/2013 | Kang et al. |
| 2013/0052447 A1 | 2/2013 | Grenci et al. |
| 2013/0123420 A1 | 5/2013 | Kim |
| 2013/0200297 A1 | 8/2013 | Saga |
| 2014/0004328 A1 | 1/2014 | Kim et al. |
| 2014/0105590 A1* | 4/2014 | Kim ............... C08K 5/19 396/529 |
| 2014/0128545 A1 | 5/2014 | Xiong et al. |
| 2014/0142571 A1 | 5/2014 | Yung et al. |
| 2015/0175805 A1 | 6/2015 | Schaefer |
| 2015/0274965 A1 | 10/2015 | Nair et al. |
| 2016/0152801 A1 | 6/2016 | Yu et al. |
| 2017/0002137 A1 | 1/2017 | Nair |
| 2017/0051147 A1* | 2/2017 | Kim ............... C08L 23/0884 |
| 2020/0022265 A1* | 1/2020 | Spiegel ............... H05K 1/0326 |
| 2020/0347303 A1 | 11/2020 | Pan et al. |
| 2021/0054190 A1 | 2/2021 | Kim |
| 2021/0057811 A1 | 2/2021 | Kim |
| 2021/0061994 A1 | 3/2021 | Kim |
| 2021/0070929 A1 | 3/2021 | Kim et al. |
| 2021/0071082 A1 | 3/2021 | Hara et al. |
| 2021/0189095 A1 | 6/2021 | Kim |
| 2021/0261755 A1 | 8/2021 | Kim |
| 2021/0261771 A1 | 8/2021 | Kim |
| 2021/0274652 A1 | 9/2021 | Kim |
| 2022/0025153 A1 | 1/2022 | Kim |
| 2022/0037050 A1 | 2/2022 | Kim |

(56) References Cited

U.S. PATENT DOCUMENTS

| | | |
|---|---|---|
| 2022/0127499 A1 | 4/2022 | Kim |
| 2022/0149541 A1 | 5/2022 | Kim et al. |

FOREIGN PATENT DOCUMENTS

| | | |
|---|---|---|
| EP | 1 116 769 A2 | 7/2001 |
| EP | 1 116 769 A3 | 7/2001 |
| EP | 1 382 437 A2 | 1/2004 |
| EP | 1 382 437 A3 | 1/2004 |
| EP | 1 699 228 A1 | 9/2006 |
| JP | H 0481451 A | 3/1992 |
| JP | H 05140282 A | 6/1993 |
| JP | H 0718162 A | 1/1995 |
| JP | H 09143347 A | 6/1997 |
| JP | H 09297256 A | 11/1997 |
| JP | H 1160927 A | 3/1999 |
| JP | H 1180517 A | 3/1999 |
| JP | H 1180518 A | 3/1999 |
| JP | H 11147999 A | 6/1999 |
| JP | 2000080289 A | 3/2000 |
| JP | 2000273292 A | 10/2000 |
| JP | 2000273320 A | 10/2000 |
| JP | 2000281885 A | 10/2000 |
| JP | 2004182895 A | 7/2004 |
| JP | 2004263162 A | 9/2004 |
| JP | 2005187696 A | 7/2005 |
| JP | 2008075079 A | 4/2008 |
| JP | 2008214573 A | 9/2008 |
| JP | 2009155436 A | 7/2009 |
| JP | 2009242454 A | 10/2009 |
| JP | 2009242455 A | 10/2009 |
| JP | 5172279 B2 | 3/2013 |
| KR | 20120114048 A | 10/2012 |
| KR | 20130047456 A | 5/2013 |
| WO | WO 2005/063889 A1 | 7/2005 |
| WO | WO 2006/104701 A1 | 10/2006 |
| WO | WO 2006/126861 A1 | 11/2006 |
| WO | WO 2009/005317 A2 | 1/2009 |
| WO | WO 2009/005317 A3 | 1/2009 |
| WO | WO 2010/013578 A1 | 2/2010 |
| WO | WO 2012/050082 A1 | 4/2012 |
| WO | WO 2013/032970 A1 | 3/2013 |
| WO | WO 2013/066003 A | 5/2013 |
| WO | WO 2013/074469 A1 | 5/2013 |
| WO | WO 2013/074475 A1 | 5/2013 |
| WO | WO 2013/129338 A1 | 9/2013 |
| WO | WO 2016/003588 A1 | 1/2016 |
| WO | WO 2016/209792 A1 | 12/2016 |
| WO | WO 2017/004064 A1 | 1/2017 |

OTHER PUBLICATIONS

Article—Möhwald et al., "Laser Beam Activation of CNT-Filled Polymer Blends," *Laser Technik Journal*, Feb. 2015, pp. 52-55 (© 2015 WILEY-VCH Verlag GmbH & Co. KGaA2, Weinheim).

Article—Zaderej et al., "ASEP (Application Specific Electronics Package) A Next Generation Electronics Manufacturing Technology," Proceedings of SMTA International, 2018, 8 pages Product and Property Guide for DuPont™ Zenite® LCP liquid crystal polymer resin, May 2006, 33 pages.

Product Information—Sigrafil® C, The Carbon Fiber for Thermoplastic Compounds from SGL Group, 2009, 4 pages.

Product Information on Talc from Nipgon Talc Co., Ltd., 5 pages.

Related Application Form.

Search Report and Written Opinion for PCT/US2021/018471 dated May 5, 2021, 9 pages.

Prabuddha Bansal, U.S. Appl. No. 17/893,267, filed Aug. 23, 2022, Multi-Layered Composite for EMI Shielding.

\* cited by examiner

ELECTRONIC DEVICE

CROSS REFERENCE TO RELATED APPLICATIONS

The present application claims filing benefit of U.S. Provisional Patent Application Ser. No. 62/981,667 having a filing date of Feb. 26, 2020 and U.S. Provisional Patent Application Ser. No. 63/057,345 having a filing date of Jul. 28, 2020, which are incorporated herein by reference in their entirety.

BACKGROUND OF THE INVENTION

Molded interconnect devices ("MIDs") are three-dimensional electromechanical parts that typically include plastic components and electronic circuit traces. A plastic substrate or housing is created and electrical circuits and devices are plated, layered or implanted upon the plastic substrate. MIDs typically have fewer parts than conventionally produced devices, which results in space and weight savings. Current processes for manufacturing MIDs include two-shot molding and laser direct structuring. Laser direct structuring, for instance, involves the steps of injection molding, laser activation of the plastic material, and then metallization. The laser etches a wiring pattern onto the part and prepares it for metallization. Despite the benefits of such devices, there is still a need for electronics packages that can be used in smaller spaces and that can operate at higher speeds, while simultaneously using less power and being relatively inexpensive to manufacture. One technique that has been developed to help solve these problems is known as "Application Specific Electronics Packaging ("ASEP"). Such packaging systems enable the manufacture of products using reel-to-reel (continuous flow) manufacturing processes by relying upon the use of a plated plastic substrate that is molded onto a singulated carrier portion. Unfortunately, one of the limitations of these systems is that the polymeric materials used for the plastic substrate are not easily plated with conductive circuit traces and also do not typically possess the desired degree of heat resistance and mechanical strength.

As such, a need currently exists for an improved packaged electronic device that is formed from a plastic substrate with conductive circuit traces.

SUMMARY OF THE INVENTION

In accordance with one embodiment of the present invention, an electronic device is disclosed that comprises a singulated carrier portion, a substrate molded onto the singulated carrier portion, and conductive traces disposed on the substrate. The substrate comprises a polymer composition that includes an aromatic polymer and an electrically conductive filler, wherein the polymer composition exhibits a surface resistivity of from about $1 \times 10^{12}$ ohms to about $1 \times 10^{18}$ ohms as determined in accordance with ASTM D257-14.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
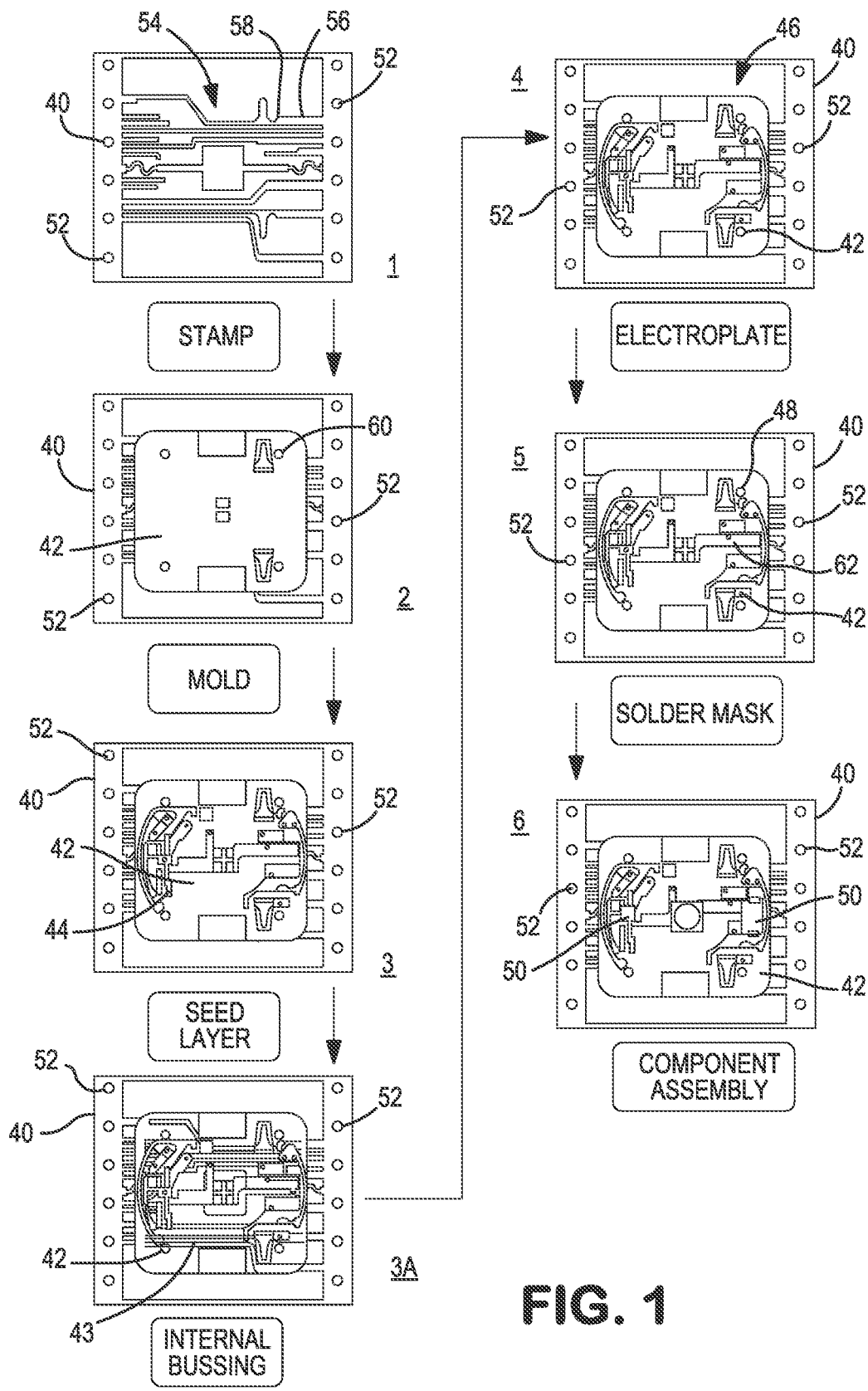
FIG. 1 is a flow diagram of one embodiment of a manufacturing process that may be employed to form the electronic device of the present invention.

It is to be understood by one of ordinary skill in the art that the present discussion is a description of exemplary embodiments only, and is not intended as limiting the broader aspects of the present invention.

Generally speaking, the present invention is directed to an electronic device, such as a printed circuit board, flex circuit, connector, thermal management feature, EMI shielding, high current conductor, RFID apparatus, antenna, wireless power device, sensor, MEMS apparatus, LED device, microprocessor, memory device, ASIC, passive device, impedance control device, electro-mechanical apparatus, or a combination thereof. The electronic device contains a substrate that is molded onto a singulated carrier portion and has conductive traces disposed thereon. Notably, the substrate contains an aromatic polymer and an electrically conductive filler in an amount such that the resulting surface resistivity is within a specific range, such as from about $1 \times 10^{12}$ ohms to about $1 \times 10^{18}$ ohms, in some embodiments from about $1 \times 10^{13}$ ohms to about $1 \times 10^{18}$ ohms, in some embodiments from about $1 \times 10^{14}$ ohms to about $1 \times 10^{17}$ ohms, and in some embodiments, from about $1 \times 10^{15}$ ohms to about $1 \times 10^{17}$ ohms, such as determined in accordance with ASTM D257-14 (technically equivalent to IEC 62631-3-1). Likewise, the composition may also exhibit a volume resistivity of from about $1 \times 10^{10}$ ohm-m to about $1 \times 10^{16}$ ohm-m, in some embodiments from about $1 \times 10^{11}$ ohm-m to about $1 \times 10^{16}$ ohm-m, in some embodiments from about $1 \times 10^{12}$ ohm-m to about $1 \times 10^{15}$ ohm-m, and in some embodiments, from about $1 \times 10^{13}$ ohm-m to about $1 \times 10^{15}$ ohm-m, such as determined in accordance with ASTM D257-14 (technically equivalent to IEC 62631-3-1). In this manner, the substrate can be generally antistatic in nature such that a substantial amount of electrical current does not flow through the part. While being generally antistatic, the resulting substrate may nevertheless allow some degree of electrostatic dissipation to facilitate plating and deposition of conductive traces thereon.

Conventionally, it was believed that compositions having such resistivity values would also not possess good mechanical properties. Contrary to conventional thought, however, the composition of the present invention has been found to possess excellent strength properties. For example, the composition may exhibit a Charpy unnotched and/or notched impact strength of about 2 kJ/m², in some embodiments from about 4 to about 40 kJ/m², and in some embodiments, from about 6 to about 30 kJ/m², measured at 23° C. according to ISO Test No. 179-1:2010. The composition may also exhibit a tensile strength of from about 20 to about 500 MPa, in some embodiments from about 50 to about 400 MPa, and in some embodiments, from about 60 to about 350 MPa; tensile break strain of about 0.5% or more, in some embodiments from about 0.8% to about 15%, and in some embodiments, from about 1% to about 10%; and/or tensile modulus of from about 5,000 MPa to about 30,000 MPa, in some embodiments from about 7,000 MPa to about 25,000 MPa, and in some embodiments, from about 10,000 MPa to about 20,000 MPa. The tensile properties may be determined in accordance with ISO Test No. 527:2019 at 23° C. The composition may also exhibit a flexural strength of from about 40 to about 500 MPa, in some embodiments from about 50 to about 400 MPa, and in some embodiments, from about 100 to about 350 MPa; flexural break strain of about 0.5% or more, in some embodiments from about 0.8% to about 15%, and in some embodiments, from about 1% to about 10%; and/or flexural modulus of about 7,000 MPa or more, in some embodiments from about 9,000 MPa or more, in some embodiments, from about 10,000 MPa to about 30,000 MPa, and in some embodiments, from about 12,000 MPa to about 25,000 MPa. The flexural properties may be determined in accordance with ISO Test No. 178:2019 at 23° C. The composition may also exhibit a deflection temperature under load (DTUL) of about 180° C. or more, and in some embodiments, from about 190° C. to about 280° C., as measured according to ASTM D648-07 (technically equivalent to ISO Test No. 75-2:2013) at a specified load of 1.8 MPa.

The polymer composition may also exhibit a high dielectric constant of about 4 or more, in some embodiments about 5 or more, in some embodiments about 6 or more, in some embodiments from about 8 to about 30, in some embodiments from about 10 to about 25, and in some embodiments, from about 12 to about 24, as determined by the split post resonator method at a frequency of 2 GHz. Such a high dielectric constant can facilitate the ability to form a thin substrate and also allow multiple conductive elements (e.g., antennae) to be employed that operate simultaneously with only a minimal level of electrical interference. The dissipation factor, a measure of the loss rate of energy, may also be relatively low, such as about 0.3 or less, in some embodiments about 0.2 or less, in some embodiments about 0.1 or less, in some embodiments about 0.06 or less, in some embodiments about 0.04 or less, and in some embodiments, from about 0.001 to about 0.03, as determined by the split post resonator method at a frequency of 2 GHz. The present inventor has also discovered that the dielectric constant and dissipation factor can be maintained within the ranges noted above even when exposed to various temperatures, such as a temperature of from about −30° C. to about 100° C. For example, when subjected to a heat cycle test as described herein, the ratio of the dielectric constant after heat cycling to the initial dielectric constant may be about 0.8 or more, in some embodiments about 0.9 or more, and in some embodiments, from about 0.95 to about 1.1. Likewise, the ratio of the dissipation factor after being exposed to the high temperature to the initial dissipation factor may be about 1.3 or less, in some embodiments about 1.2 or less, in some embodiments about 1.1 or less, in some embodiments about 1.0 or less, in some embodiments about 0.95 or less, in some embodiments from about 0.1 to about 0.95, and in some embodiments, from about 0.2 to about 0.9. The change in dissipation factor (i.e., the initial dissipation factor—the dissipation factor after heat cycling) may also range from about −0.1 to about 0.1, in some embodiments from about −0.05 to about 0.01, and in some embodiments, from about −0.001 to 0.

Various embodiments of the present invention will now be described in more detail.

I. Polymer Composition

A. Polymer Matrix

The polymer matrix typically contains one or more aromatic polymers, generally in an amount of from about 30 wt. % to about 80 wt. %, in some embodiments from about 40 wt. % to about 75 wt. %, and in some embodiments, from about 50 wt. % to about 70 wt. % of the polymer composition. The aromatic polymers may be considered "high performance" polymers in that they have a relatively high glass transition temperature and/or high melting temperature depending on the particular nature of the polymer. Such high performance polymers can thus provide a substantial degree of heat resistance to the resulting polymer composition. For example, the aromatic polymer may have a glass transition temperature of about 100° C. or more, in some embodiments about 120° C. or more, in some embodiments from about 140° C. to about 350° C., and in some embodiments, from about 150° C. to about 320° C. The aromatic polymer may also have a melting temperature of about 200° C. or more, in some embodiments from about 220° C. to about 350° C., and in some embodiments, from about 240° C. to about 300° C. The glass transition and melting temperatures may be determined as is well known in the art using differential scanning calorimetry ("DSC"), such as determined by ISO Test No. 11357-2:2020 (glass transition) and 11357-3:2018 (melting).

The aromatic polymer can be substantially amorphous, semi-crystalline, or crystalline in nature. One example of a suitable semi-crystalline aromatic polymer, for instance, is an aromatic or semi-aromatic polyamide. Aromatic polyamides typically contain repeating units held together by amide linkages (NH—CO) and are synthesized through the polycondensation of dicarboxylic acids (e.g., aromatic dicarboxylic acids), diamines (e.g., aliphatic diamines), etc. For example, the aromatic polyamide may contain aromatic repeating units derived from an aromatic dicarboxylic acid, such as terephthalic acid, isophthalic acid, 2,6-naphthalenedicarboxylic acid, 2,7-naphthalenedicarboxylic acid, 1,4-naphthalenedicarboxylic acid, 1,4-phenylenedioxy-diacetic acid, 1,3-phenylenedioxy-diacetic acid, diphenic acid, 4,4'-oxydibenzoic acid, diphenylmethane-4,4'-dicarboxylic acid, diphenylsulfone-4,4'-dicarboxylic acid, 4,4'-biphenyldicarboxylic acid, etc., as well as combinations thereof. Terephthalic acid is particularly suitable. Of course, it should also be understood that other types of acid units may also be employed, such as aliphatic dicarboxylic acid units, polyfunctional carboxylic acid units, etc. The aromatic polyamide may also contain aliphatic repeating units derived from an aliphatic diamine, which typically has from 4 to 14 carbon atoms. Examples of such diamines include linear aliphatic alkylenediamines, such as 1,4-tetramethylenediamine, 1,6-hexanediamine, 1,7-heptanediamine, 1,8-octanediamine, 1,9-nonanediamine, 1,10-decanediamine, 1,11-undecanediamine, 1,12-dodecanediamine, etc.; branched aliphatic alkylenediamines, such as 2-methyl-1,5-pentanediamine, 3-methyl-1,5 pentanediamine, 2,2,4-trimethyl-1,6-hexanediamine, 2,4,4-trimethyl-1,6-hexanediamine, 2,4-di-methyl-1,6-hexanediamine, 2-methyl-1,8-octanediamine, 5-methyl-1,9-nonanediamine, etc.; as well as combinations thereof. Repeating units derived from 1,9-nonanediamine and/or 2-methyl-1,8-octanediamine are particularly suitable.

Of course, other diamine units may also be employed, such as alicyclic diamines, aromatic diamines, etc.

Particularly suitable polyamides may include poly(nonamethylene terephthalamide) (PA9T), poly(nonamethylene terephthalamide/nonamethylene decanediamide) (PA9T/910), poly(nonamethylene terephthalamide/nonamethylene dodecanediamide) (PA9T/912), poly(nonamethylene terephthalamide/11-aminoundecanamide) (PA9T/11), poly(nonamethylene terephthalamide/12-aminododecanamide) (PA9T/12), poly(decamethylene terephthalamide/11-aminoundecanamide) (PA10T/11), poly(decamethylene terephthalamide/12-aminododecanamide) (PA10T/12), poly(decamethylene terephthalamide/decamethylene decanediamide) (PA10T/1010), poly(decamethylene terephthalamide/decamethylene dodecanediamide) (PA10T/1012), poly(decamethylene terephlhalamide/tetramethylene hexanediamide) (PA10T/46), poly(decamethylene terephthalamide/caprolactam) (PA10T/6), poly(decamethylene terephthalamide/hexamethylene hexanediamide) (PA10T/66), poly(dodecamethylene lerephthalamide/dodecamelhylene dodecanediarnide) (PA12T/1212), poly(dodecamethylene terephthalamide/caprolactam) (PA12T/6), poly(dodecamethylene terephthalamide/hexamethylene hexanediamide) (PA12T/66), and so forth. Yet other examples of suitable aromatic polyamides are described in U.S. Pat. No. 8,324,307 to Harder, et al.

Another suitable semi-crystalline aromatic polymer that may be employed is an aromatic polyester that is a condensation product of an aromatic dicarboxylic acid having 8 to 14 carbon atoms and at least one diol. Suitable diols may include, for instance, neopentyl glycol, cyclohexanedimethanol, 2,2-dimethyl-1,3-propane diol and aliphatic glycols of the formula $HO(CH_2)_nOH$ where n is an integer of 2 to 10. Suitable aromatic dicarboxylic acids may include, for instance, isophthalic acid, terephthalic acid, 1,2-di(p-carboxyphenyl)ethane, 4,4'-dicarboxydiphenyl ether, etc., as well as combinations thereof. Fused rings can also be present such as in 1,4- or 1,5- or 2,6-naphthalene-dicarboxylic acids. Particular examples of such aromatic polyesters include poly(ethylene terephthalate) (PET), poly(1,4-butylene terephthalate) (PBT), poly(1,3-propylene terephthalate) (PPT), poly(1,4-butylene 2,6-naphthalate) (PBN), poly(ethylene 2,6-naphthalate) (PEN), poly(1,4-cyclohexylenedimethylene terephthalate) (PCT), as well as copolymer, derivatives, and mixtures of the foregoing.

In addition, modified or copolymers of such aromatic polyesters may also be used. For instance, in one embodiment, a modifying acid or a modifying diol may be used to produce modified polyethylene terephthalate polymers and/or modified polybutylene terephthalate polymers. As used herein, the terms "modifying acid" and "modifying diol" are meant to define compounds, which can form part of the acid and diol repeat units of a polyester, respectively, and which can modify a polyester to reduce its crystallinity or render the polyester amorphous. Of course, the polyesters may be non-modified and do not contain a modifying acid or a modifying diol. In any event, examples of modifying acid components may include, but are not limited to, isophthalic acid, phthalic acid, 1,3-cyclohexanedicarboxylic acid, 1,4-cyclohexane dicarboxylic acid, 2,6-naphthaline dicarboxylic acid, succinic acid, glutaric acid, adipic acid, sebacic acid, suberic acid, 1,12-dodecanedioic acid, etc. In practice, it is often preferable to use a functional acid derivative thereof such as the dimethyl, diethyl, or dipropyl ester of the dicarboxylic acid. The anhydrides or acid halides of these acids also may be employed where practical. Examples of modifying diol components may include, but are not limited to, neopentyl glycol, 1,4-cyclohexanedimethanol, 1,2-propanediol, 1,3-propanediol, 2-methy-1,3-propanediol, 1,4-butanediol, 1,6-hexanediol, 1,2-cyclohexanediol, 1,4-cyclohexanediol, 1,2-cyclohexanedimethanol, 1,3-cyclohexanedimethanol, 2,2,4,4-tetramethyl 1,3-cyclobutane diol, Z,8-bis(hydroxymethyltricyclo-[5.2.1.0]-decane wherein Z represents 3, 4, or 5; 1,4-bis(2-hydroxyethoxy)benzene, 4,4'-bis(2-hydroxyethoxy)diphenylether [bis-hydroxyethyl bisphenol A], 4,4'-Bis(2-hydroxyethoxy)diphenylsulfide [bis-hydroxyethyl bisphenol S] and diols containing one or more oxygen atoms in the chain, e.g., diethylene glycol, triethylene glycol, dipropylene glycol, tripropylene glycol, etc. In general, these diols contain 2 to 18, and in some embodiments, 2 to 8 carbon atoms. Cycloaliphatic diols can be employed in their cis- or trans-configuration or as mixtures of both forms.

Polyarylene sulfides are also suitable semi-crystalline aromatic polymers. The polyarylene sulfide may be homopolymers or copolymers. For instance, selective combination of dihaloaromatic compounds can result in a polyarylene sulfide copolymer containing not less than two different units. For instance, when p-dichlorobenzene is used in combination with m-dichlorobenzene or 4,4'-dichlorodiphenylsulfone, a polyarylene sulfide copolymer can be formed containing segments having the structure of formula:

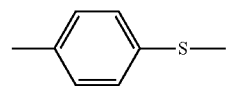

and segments having the structure of formula:

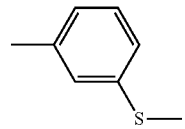

or segments having the structure of formula:

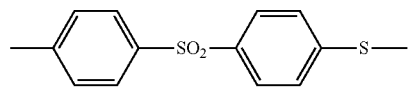

The polyarylene sulfide may be linear, semi-linear, branched or crosslinked. Linear polyarylene sulfides typically contain 80 mol % or more of the repeating unit —(Ar—S)—. Such linear polymers may also include a small amount of a branching unit or a cross-linking unit, but the amount of branching or cross-linking units is typically less than about 1 mol % of the total monomer units of the polyarylene sulfide. A linear polyarylene sulfide polymer may be a random copolymer or a block copolymer containing the above-mentioned repeating unit. Semi-linear polyarylene sulfides may likewise have a cross-linking structure or a branched structure introduced into the polymer a small amount of one or more monomers having three or more reactive functional groups. By way of example, monomer components used in forming a semi-linear polyarylene sulfide can include an amount of polyhaloaromatic compounds having two or more halogen substituents per molecule which can be utilized in preparing branched polymers. Such monomers can be represented by the formula R'X$_n$, where each X is selected from chlorine, bromine, and iodine, n is an integer of 3 to 6, and R' is a polyvalent aromatic radical of valence n which can have up to about 4 methyl substituents, the total number of carbon atoms in R' being within the range of 6 to about 16. Examples of some polyhaloaromatic compounds having more than two halogens substituted per molecule that can be employed in forming a semi-linear polyarylene sulfide include 1,2,3-trichlorobenzene, 1,2,4-trichlorobenzene, 1,3-dichloro-5-bromobenzene, 1,2,4-triiodobenzene, 1,2,3,5-tetrabromobenzene, hexachlorobenzene, 1,3,5-trichloro-2,4,6-trimethylbenzene, 2,2',4,4'-tetrachlorobiphenyl, 2,2',5,5'-tetra-iodobiphenyl, 2,2',6,6'-tetrabromo-3,3',5,5'-tetramethylbiphenyl, 1,2,3,4-tetrachloronaphthalene, 1,2,4-tribromo-6-methylnaphthalene, etc., and mixtures thereof.

As indicated above, substantially amorphous polymers may also be employed in the polymer composition that lack a distinct melting point temperature. Suitable amorphous polymers may include, for instance, polyphenylene oxide ("PPO"), aromatic polycarbonates, aromatic polyetherimides, etc. Aromatic polycarbonates, for instance, typically have a glass transition temperature of from about 130° C. to about 160° C. and contain aromatic repeating units derived from one or more aromatic diols. Particularly suitable aromatic diols are bisphenols, such as gem-bisphenols in which two phenols groups are attached to a single carbon atom of a bivalent connecting radical. Examples of such bisphenols may include, for instance, such as 4,4'-isopropylidenediphenol ("bisphenol A"), 4,4'-ethylidenediphenol, 4,4'-(4-chloro-a-methylbenzylidene)diphenol, 4,4'cyclohexylidenediphenol, 4,4 (cyclohexylmethylene)diphenol, etc., as well as combinations thereof. The aromatic diol may be reacted with a phosgene. For example, the phosgene may be a carbonyl chloride having the formula C(O)Cl$_2$. An alternative route to the synthesis of an aromatic polycarbonate may involve the transesterification of the aromatic diol (e.g., bisphenol) with a diphenyl carbonate.

In addition to the polymers referenced above, crystalline polymers may also be employed in the polymer composition. Particularly suitable are liquid crystalline polymers, which have a high degree of crystallinity that enables them to effectively fill the small spaces of a mold. Liquid crystalline polymers are generally classified as "thermotropic" to the extent that they can possess a rod-like structure and exhibit a crystalline behavior in their molten state (e.g., thermotropic nematic state). Such polymers may be formed from one or more types of repeating units as is known in the art. A liquid crystalline polymer may, for example, contain one or more aromatic ester repeating units generally represented by the following Formula (I):

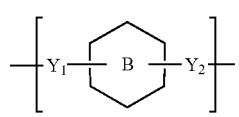

(I)

wherein, ring B is a substituted or unsubstituted 6-membered aryl group (e.g., 1,4-phenylene or 1,3-phenylene), a substituted or unsubstituted 6-membered aryl group fused to a substituted or unsubstituted 5- or 6-membered aryl group (e.g., 2,6-naphthalene), or a substituted or unsubstituted 6-membered aryl group linked to a substituted or unsubstituted 5- or 6-membered aryl group (e.g., 4,4-biphenylene); and Y$_1$ and Y$_2$ are independently O, C(O), NH, C(O)HN, or NHC(O).

Typically, at least one of Y$_1$ and Y$_2$ are C(O). Examples of such aromatic ester repeating units may include, for instance, aromatic dicarboxylic repeating units (Y$_1$ and Y$_2$ in Formula I are C(O)), aromatic hydroxycarboxylic repeating units (Y$_1$ is O and Y$_2$ is C(O) in Formula I), as well as various combinations thereof.

Aromatic hydroxycarboxylic repeating units, for instance, may be employed that are derived from aromatic hydroxycarboxylic acids, such as, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof, and combination thereof. Particularly suitable aromatic hydroxycarboxylic acids are 4-hydroxybenzoic acid ("HBA") and 6-hydroxy-2-naphthoic acid ("HNA"). When employed, repeating units derived from hydroxycarboxylic acids (e.g., HBA and/or HNA) typically constitute about 40 mol. % or more, in some embodiments about 45 mol. % or more, and in some embodiments, from about 50 mol. % to 100 mol. % of the polymer. In one embodiment, for example, repeating units derived from HBA may constitute from about 30 mol. % to about 90 mol. % of the polymer, in some embodiments from about 40 mol. % to about 85 mol. % of the polymer, and in some embodiments, from about 50 mol. % to about 80 mol. % of the polymer. Repeating units derived from HNA may likewise constitute from about 1 mol. % to about 30 mol. % of the polymer, in some embodiments from about 2 mol. % to about 25 mol. % of the polymer, and in some embodiments, from about 3 mol. % to about 15 mol. % of the polymer.

Aromatic dicarboxylic repeating units may also be employed that are derived from aromatic dicarboxylic acids, such as terephthalic acid, isophthalic acid, 2,6-naphthalenedicarboxylic acid, diphenyl ether-4,4'-dicarboxylic acid, 1,6-naphthalenedicarboxylic acid, 2,7-naphthalenedicarboxylic acid, 4,4'-dicarboxybiphenyl, bis(4-carboxyphenyl) ether, bis(4-carboxyphenyl)butane, bis(4-carboxyphenyl) ethane, bis(3-carboxyphenyl)ether, bis(3-carboxyphenyl) ethane, etc., as well as alkyl, alkoxy, aryl and halogen substituents thereof, and combinations thereof. Particularly suitable aromatic dicarboxylic acids may include, for instance, terephthalic acid ("TA"), isophthalic acid ("IA"), and 2,6-naphthalenedicarboxylic acid ("NDA"). When employed, repeating units derived from aromatic dicarboxylic acids (e.g., IA, TA, and/or NDA) typically constitute from about 1 mol. % to about 50 mol. %, in some embodiments from about 2 mol. % to about 40 mol. %, and in some embodiments, from about 5 mol. % to about 30% of the polymer.

Other repeating units may also be employed in the polymer. In certain embodiments, for instance, repeating units may be employed that are derived from aromatic diols, such as hydroquinone, resorcinol, 2,6-dihydroxynaphthalene, 2,7-dihydroxynaphthalene, 1,6-dihydroxynaphthalene, 4,4'-dihydroxybiphenyl (or 4,4'-biphenol), 3,3'-dihydroxybiphenyl, 3,4'-dihydroxybiphenyl, 4,4'-dihydroxybiphenyl ether, bis(4-hydroxyphenyl)ethane, etc., as well as alkyl, alkoxy, aryl and halogen substituents thereof, and combinations thereof. Particularly suitable aromatic diols may include, for instance, hydroquinone ("HQ") and 4,4'-biphenol ("BP").

When employed, repeating units derived from aromatic diols (e.g., HQ and/or BP) typically constitute from about 1 mol. % to about 30 mol. %, in some embodiments from about 2 mol. % to about 25 mol. %, and in some embodiments, from about 5 mol. % to about 20% of the polymer. Repeating units may also be employed, such as those derived from aromatic amides (e.g., acetaminophen ("APAP")) and/or aromatic amines (e.g., 4-aminophenol ("AP"), 3-aminophenol, 1,4-phenylenediamine, 1,3-phenylenediamine, etc.). When employed, repeating units derived from aromatic amides (e.g., APAP) and/or aromatic amines (e.g., AP) typically constitute from about 0.1 mol. % to about 20 mol. %, in some embodiments from about 0.5 mol. % to about 15 mol. %, and in some embodiments, from about 1 mol. % to about 10% of the polymer. It should also be understood that various other monomeric repeating units may be incorporated into the polymer. For instance, in certain embodiments, the polymer may contain one or more repeating units derived from non-aromatic monomers, such as aliphatic or cycloaliphatic hydroxycarboxylic acids, dicarboxylic acids, diols, amides, amines, etc. Of course, in other embodiments, the polymer may be "wholly aromatic" in that it lacks repeating units derived from non-aromatic (e.g., aliphatic or cycloaliphatic) monomers.

Although not necessarily required, the liquid crystalline polymer may be a "low naphthenic" polymer to the extent that it contains a relatively low content of repeating units derived from naphthenic hydroxycarboxylic acids and naphthenic dicarboxylic acids, such as naphthalene-2,6-dicarboxylic acid ("NDA"), 6-hydroxy-2-naphthoic acid ("HNA"), or combinations thereof. That is, the total amount of repeating units derived from naphthenic hydroxycarboxylic and/or dicarboxylic acids (e.g., NDA, HNA, or a combination of HNA and NDA) is typically about 15 mol. % or less, in some embodiments about 10 mol. % or less, and in some embodiments, from about 1 mol. % to about 8 mol. % of the polymer.

In certain embodiments of the present invention, blends of aromatic polymers may also be employed to help achieve the desired properties of the polymer composition. For example, the polymer composition may contain a liquid crystalline polymer in combination with a semi-crystalline aromatic polyester, such as those described above. In one particular embodiment, for instance, the aromatic polyester may be a polyalkylene terephthalate, such as poly(1,4-cyclohexylenedimethylene terephthalate) (PCT), as well as copolymers and derivatives thereof. When such a blend is employed, liquid crystalline polymers may constitute from about 30 wt. % to about 85 wt. %, in some embodiments from about 40 wt. % to about 80 wt. %, and in some embodiments, from about 60 wt. % to about 75 wt. % of the blend, while the semi-crystalline aromatic polyesters may likewise constitute from about 15 wt. % to about 70 wt. %, in some embodiments from about 20 wt. % to about 60 wt. %, and in some embodiments, from about 25 wt. % to about 40 wt. % of the blend. Liquid crystalline polymers may, for instance, may constitute from about 15 wt. % to about 85 wt. %, in some embodiments from about 20 wt. % to about 75 wt. %, and in some embodiments, from about 30 wt. % to about 50 wt. % of the entire polymer composition, while the semi-crystalline aromatic polyesters may likewise constitute from about 1 wt. % to about 50 wt. %, in some embodiments from about 5 wt. % to about 45 wt. %, and in some embodiments, from about 10 wt. % to about 40 wt. % of the entire polymer composition.

B. Electrically Conductive Filler

As indicated above, an electrically conductive filler is also employed in the polymer composition to achieve the desired surface and/or volume resistivity values for the polymer composition. This may be accomplished by selecting a single material for the filler having the desired resistivity, or by blending multiple materials together (e.g., insulative and electrically conductive) so that the resulting filler has the desired resistivity. In one particular embodiment, for example, an electrically conductive material may be employed that has a volume resistivity of less than about 1 ohm-cm, in some embodiments about less than about 0.1 ohm-cm, and in some embodiments, from about $1\times10^{-8}$ to about $1\times10^{-2}$ ohm-cm, such as determined at a temperature of about 20° C. in accordance with ASTM D257-14 (technically equivalent to IEC 62631-3-1). Suitable electrically conductive materials may include, for instance, carbon materials, such as graphite, carbon black, carbon fibers, graphene, carbon nanotubes, etc. Other suitable electrically conductive fillers may likewise include metals (e.g., metal particles, metal flakes, metal fibers, etc.), ionic liquids, and so forth. Regardless of the materials employed, the electrically conductive filler typically constitutes from about 0.5 to about 20 parts, in some embodiments from about 1 to about 15 parts, and in some embodiments, from about 2 to about 8 parts by weight per 100 parts by weight of the polymer matrix. For example, the electrically conductive filler may constitute from about 0.1 wt. % to about 10 wt. %, in some embodiments from about 0.2 wt. % to about 8 wt. %, and in some embodiments, from about 0.5 wt. % to about 4 wt. % of the polymer composition.

C. Mineral Filler

If desired, the polymer composition may also contain one or more mineral fillers distributed within the polymer matrix. Such mineral fillers typically constitute from about 10 to about 80 parts, in some embodiments from about 20 to about 70 parts, and in some embodiments, from about 30 to about 60 parts per 100 parts by weight of the polymer matrix. The mineral filler may, for instance, constitute from about 5 wt. % to about 60 wt. %, in some embodiments from about 10 wt. % to about 55 wt. %, and in some embodiments, from about 25 wt. % to about 40 wt. % of the polymer composition. Further, the weight ratio of the mineral filler to the electrically conductive filler may range from about 2 to about 500, in some embodiments from about 3 to about 150, in some embodiments from about 4 to about 75, and in some embodiments, from about 5 to about 15. By selectively tailoring the type and relative amount of the mineral filler, the present inventor has not only discovered that the mechanical properties can be improved, but also that the thermal conductivity can be increased without significantly impacting the overall electrical conductivity of the polymer composition. This allows the composition to be capable of creating a thermal pathway for heat transfer away from the resulting electronic device so that "hot spots" can be quickly eliminated and the overall temperature can be lowered during use. The composition may, for example, exhibit an in-plane thermal conductivity of about 0.2 W/m-K or more, in some embodiments about 0.5 W/m-K or more, in some embodiments about 0.6 W/m-K or more, in some embodiments about 0.8 W/m-K or more, and in some embodiments, from about 1 to about 3.5 W/m-K, as determined in accordance with ASTM E 1461-13. The composition may also exhibit a through-plane thermal conductivity of about 0.3 W/m-K or more, in some embodiments about 0.5 W/m-K or more, in some embodiments about 0.40 W/m-K or more, and in some embodiments, from about 0.7 to about 2 W/m-K, as determined in accordance with ASTM E 1461-13. Notably, it has been discovered that such a thermal conductivity can be achieved without use of conventional materials having a high degree of intrinsic thermal conductivity. For example, the polymer composition may be generally free of fillers having an intrinsic thermal conductivity of 50 W/m-K or more, in some embodiments 100 W/m-K or more, and in some embodiments, 150 W/m-K or more. Examples of such high intrinsic thermally conductive materials may include, for instance, boron nitride, aluminum nitride, magnesium silicon nitride, graphite (e.g., expanded graphite), silicon carbide, carbon nanotubes, zinc oxide, magnesium oxide, beryllium oxide, zirconium oxide, yttrium oxide, aluminum powder, and copper powder. While it is normally desired to minimize the presence of such high intrinsic thermally conductive materials, they may nevertheless be present in a relatively small percentage in certain embodiments, such as in an amount of about 10 wt. % or less, in some embodiments about 5 wt. % or less, and in some embodiments, from about 0.01 wt. % to about 2 wt. % of the polymer composition.

The nature of the mineral filler employed in the polymer composition may vary, such as mineral particles, mineral fibers (or "whiskers"), etc., as well as blends thereof. Suitable mineral fibers may, for instance, include those that are derived from silicates, such as neosilicates, sorosilicates, inosilicates (e.g., calcium inosilicates, such as wollastonite; calcium magnesium inosilicates, such as tremolite; calcium magnesium iron inosilicates, such as actinolite; magnesium iron inosilicates, such as anthophyllite; etc.), phyllosilicates (e.g., aluminum phyllosilicates, such as palygorskite), tectosilicates, etc.; sulfates, such as calcium sulfates (e.g., dehydrated or anhydrous gypsum); mineral wools (e.g., rock or slag wool); and so forth. Particularly suitable are inosilicates, such as wollastonite fibers available from Nyco Minerals under the trade designation NYGLOS® (e.g., NYGLOS® 4 W or NYGLOS® 8). The mineral fibers may have a median diameter of from about 1 to about 35 micrometers, in some embodiments from about 2 to about 20 micrometers, in some embodiments from about 3 to about 15 micrometers, and in some embodiments, from about 7 to about 12 micrometers. The mineral fibers may also have a narrow size distribution. That is, at least about 60% by volume of the fibers, in some embodiments at least about 70% by volume of the fibers, and in some embodiments, at least about 80% by volume of the fibers may have a size within the ranges noted above. Without intending to be limited by theory, it is believed that mineral fibers having the size characteristics noted above can more readily move through molding equipment, which enhances the distribution within the polymer matrix and minimizes the creation of surface defects. In addition to possessing the size characteristics noted above, the mineral fibers may also have a relatively high aspect ratio (average length divided by median diameter) to help further improve the mechanical properties and surface quality of the resulting polymer composition. For example, the mineral fibers may have an aspect ratio of from about 2 to about 100, in some embodiments from about 2 to about 50, in some embodiments from about 3 to about 20, and in some embodiments, from about 4 to about 15. The volume average length of such mineral fibers may, for example, range from about 1 to about 200 micrometers, in some embodiments from about 2 to about 150 micrometers, in some embodiments from about 5 to about 100 micrometers, and in some embodiments, from about 10 to about 50 micrometers.

Other suitable mineral fillers are mineral particles. The average diameter of the particles may, for example, range from about 5 micrometers to about 200 micrometers, in some embodiments from about 8 micrometers to about 150 micrometers, and in some embodiments, from about 10 micrometers to about 100 micrometers. The shape of the particles may vary as desired, such as granular, flake-shaped, etc. Flake-shaped particles, for instance, may be employed that have a relatively high aspect ratio (e.g., average diameter divided by average thickness), such as about 4 or more, in some embodiments about 8 or more, and in some embodiments, from about 10 to about 500. The average thickness of such flake-shaped particles may likewise be about 2 micrometers or less, in some embodiments from about 5 nanometers to about 1 micrometer, and in some embodiments, from about 20 nanometers to about 500 nanometers. Regardless of their shape and size, the particles are typically formed from a natural and/or synthetic silicate mineral, such as talc, mica, halloysite, kaolinite, illite, montmorillonite, vermiculite, palygorskite, pyrophyllite, calcium silicate, aluminum silicate, wollastonite, etc. Talc and mica are particularly suitable. Any form of mica may generally be employed, including, for instance, muscovite ($KAl_2(AlSi_3)O_{10}(OH)_2$), biotite ($K(Mg,Fe)_3(AlSi_3)O_{10}(OH)_2$), phlogopite ($KMg_3(AlSi_3)O_{10}(OH)_2$), lepidolite ($K(Li,Al)_{2-3}(AlSi_3)O_{10}(OH)_2$), glauconite ($(K,Na)(Al,Mg,Fe)_2(Si,Al)_4O_{10}(OH)_2$), etc. Muscovite-based mica is particularly suitable for use in the polymer composition.

D. Optional Components

A wide variety of additional additives can also be included in the polymer composition, such as glass fibers, impact modifiers, lubricants, pigments (e.g., carbon black), antioxidants, stabilizers, surfactants, waxes, flame retardants, anti-drip additives, nucleating agents (e.g., boron nitride) and other materials added to enhance properties and processability. Lubricants, for example, may be employed in the polymer composition in an amount from about 0.05 wt. % to about 1.5 wt. %, and in some embodiments, from about 0.1 wt. % to about 0.5 wt. % (by weight) of the polymer composition. Examples of such lubricants include fatty acids esters, the salts thereof, esters, fatty acid amides, organic phosphate esters, and hydrocarbon waxes of the type commonly used as lubricants in the processing of engineering plastic materials, including mixtures thereof. Suitable fatty acids typically have a backbone carbon chain of from about 12 to about 60 carbon atoms, such as myristic acid, palmitic acid, stearic acid, arachic acid, montanic acid, octadecinic acid, parinric acid, and so forth. Suitable esters include fatty acid esters, fatty alcohol esters, wax esters, glycerol esters, glycol esters and complex esters. Fatty acid amides include fatty primary amides, fatty secondary amides, methylene and ethylene bisamides and alkanolamides such as, for example, palmitic acid amide, stearic acid amide, oleic acid amide, N,N'-ethylenebisstearamide and so forth. Also suitable are the metal salts of fatty acids such as calcium stearate, zinc stearate, magnesium stearate, and so forth; hydrocarbon waxes, including paraffin waxes, polyolefin and oxidized polyolefin waxes, and microcrystalline waxes. Particularly suitable lubricants are acids, salts, or amides of stearic acid, such as pentaerythritol tetrastearate, calcium stearate, or N,N'-ethylenebisstearamide. Yet another suitable lubricant may be a siloxane polymer that improves internal lubrication and that also helps to bolster the wear and friction properties of the composition encountering another surface. Such siloxane polymers typically constitute from about 0.2 to about 20 parts, in some embodiments from about 0.5 to about 10 parts, and in some embodiments, from about 0.8 to about 5 parts per 100 parts of the polymer matrix employed in the composition. Any of a variety of siloxane polymers may generally be employed. The siloxane polymer may, for instance, encompass any polymer, copolymer or oligomer that includes siloxane units in the backbone having the formula:

$$R_rSiO_{(4-r/2)}$$

wherein

R is independently hydrogen or substituted or unsubstituted hydrocarbon radicals, and r is 0, 1, 2 or 3.

Some examples of suitable radicals R include, for instance, alkyl, aryl, alkylaryl, alkenyl or alkynyl, or cycloalkyl groups, optionally substituted, and which may be interrupted by heteroatoms, i.e., may contain heteroatom(s) in the carbon chains or rings. Suitable alkyl radicals, may include, for instance, methyl, ethyl, n-propyl, isopropyl, n-butyl, isobutyl, tert-butyl, n-pentyl, isopentyl, neopentyl and tert-pentyl radicals, hexyl radicals (e.g., n-hexyl), heptyl radicals (e.g., n-heptyl), octyl radicals (e.g., n-octyl), isooctyl radicals (e.g., 2,2,4-trimethylpentyl radical), nonyl radicals (e.g., n-nonyl), decyl radicals (e.g., n-decyl), dodecyl radicals (e.g., n-dodecyl), octadecyl radicals (e.g., n-octadecyl), and so forth. Likewise, suitable cycloalkyl radicals may include cyclopentyl, cyclohexyl, cycloheptyl radicals, methylcyclohexyl radicals, and so forth; suitable aryl radicals may include phenyl, biphenyl, naphthyl, anthryl, and phenanthryl radicals; suitable alkylaryl radicals may include o-, m- or p-tolyl radicals, xylyl radicals, ethylphenyl radicals, and so forth; and suitable alkenyl or alkynyl radicals may include vinyl, 1-propenyl, 1-butenyl, 1-pentenyl, 5-hexenyl, butadienyl, hexadienyl, cyclopentenyl, cyclopentadienyl, cyclohexenyl, ethynyl, propargyl, 1-propynyl, and so forth. Examples of substituted hydrocarbon radicals are halogenated alkyl radicals (e.g., 3-chloropropyl, 3,3,3-trifluoropropyl, and perfluorohexylethyl) and halogenated aryl radicals (e.g., p-chlorophenyl and p-chlorobenzyl). In one particular embodiment, the siloxane polymer includes alkyl radicals (e.g., methyl radicals) bonded to at least 70 mol % of the Si atoms and optionally vinyl and/or phenyl radicals bonded to from 0.001 to 30 mol % of the Si atoms. The siloxane polymer is also preferably composed predominantly of diorganosiloxane units. The end groups of the polyorganosiloxanes may be trialkylsiloxy groups, in particular the trimethylsiloxy radical or the dimethylvinylsiloxy radical. However, it is also possible for one or more of these alkyl groups to have been replaced by hydroxy groups or alkoxy groups, such as methoxy or ethoxy radicals. Particularly suitable examples of the siloxane polymer include, for instance, dimethylpolysiloxane, phenylmethylpolysiloxane, vinylmethylpolysiloxane, and trifluoropropylpolysiloxane.

The siloxane polymer may also include a reactive functionality on at least a portion of the siloxane monomer units of the polymer, such as one or more of vinyl groups, hydroxyl groups, hydrides, isocyanate groups, epoxy groups, acid groups, halogen atoms, alkoxy groups (e.g., methoxy, ethoxy and propoxy), acyloxy groups (e.g., acetoxy and octanoyloxy), ketoximate groups (e.g., dimethylketoxime, methylketoxime and methylethylketoxime), amino groups(e.g., dimethylamino, diethylamino and butylamino), amido groups (e.g., N-methylacetamide and N-ethylacetamide), acid amido groups, amino-oxy groups, mercapto groups, alkenyloxy groups (e.g., vinyloxy, isopropenyloxy, and 1-ethyl-2-methylvinyloxy), alkoxyalkoxy groups (e.g., methoxyethoxy, ethoxyethoxy and methoxypropoxy), aminoxy groups (e.g., dimethylaminoxy and diethylaminoxy), mercapto groups, etc.

Regardless of its particular structure, the siloxane polymer typically has a relatively high molecular weight, which reduces the likelihood that it migrates or diffuses to the surface of the polymer composition and thus further minimizes the likelihood of phase separation. For instance, the siloxane polymer typically has a weight average molecular weight of about 100,000 grams per mole or more, in some embodiments about 200,000 grams per mole or more, and in some embodiments, from about 500,000 grams per mole to about 2,000,000 grams per mole. The siloxane polymer may also have a relative high kinematic viscosity, such as about 10,000 centistokes or more, in some embodiments about 30,000 centistokes or more, and in some embodiments, from about 50,000 to about 500,000 centistokes.

If desired, silica particles (e.g., fumed silica) may also be employed in combination with the siloxane polymer to help improve its ability to be dispersed within the composition. Such silica particles may, for instance, have a particle size of from about 5 nanometers to about 50 nanometers, a surface area of from about 50 square meters per gram ($m^2/g$) to about 600 $m^2/g$, and/or a density of from about 160 kilogram per cubic meter ($kg/m^3$) to about 190 $kg/m^3$. When employed, the silica particles typically constitute from about 1 to about 100 parts, and in some some embodiments, from about 20 to about 60 parts by weight based on 100 parts by weight of the siloxane polymer. In one embodiment, the silica particles can be combined with the siloxane polymer prior to addition of this mixture to the polymer composition. For instance, a mixture including an ultrahigh molecular weight polydimethylsiloxane and fumed silica can be incorporated in the polymer composition. Such a pre-formed mixture is available as Genioplast® Pellet S from Wacker Chemie, AG.

One benefit of the present invention is that the polymer composition can be readily plated without the use of conventional laser activatable spinel crystals, which generally have the formula, $AB_2O_4$, wherein A is a metal cation having a valance of 2 (e.g., cadmium, chromium, manganese, nickel, zinc, copper, cobalt, iron, magnesium, tin, or titanium) and B is a metal cation having a valance of 3 (e.g., chromium, iron, aluminum, nickel, manganese, or tin). Typically, A in the formula above provides the primary cation component of a first metal oxide cluster and B provides the primary cation component of a second metal oxide cluster. For example, the first metal oxide cluster generally has a tetrahedral structure and the second metal oxide cluster generally has an octahedral cluster. Particular examples of such spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, or $MgCr_2O_4$. The polymer composition may be free of such spinel crystals (i.e., 0 wt. %), or such crystals may be present in only a small concentration, such as in an amount of about 1 wt. % or less, in some embodiments about 0.5 wt. % or less, and in some embodiments, from about 0.001 wt. % to about 0.2 wt. %.

II. Formation

The components of the polymer composition (e.g., aromatic polymer(s), electrically conductive filler, mineral filler, etc.) may be melt processed or blended together. The components may be supplied separately or in combination to an extruder that includes at least one screw rotatably mounted and received within a barrel (e.g., cylindrical barrel) and may define a feed section and a melting section located downstream from the feed section along the length of the screw. The extruder may be a single screw or twin screw extruder. The speed of the screw may be selected to achieve the desired residence time, shear rate, melt processing temperature, etc. For example, the screw speed may range from about 50 to about 800 revolutions per minute ("rpm"), in some embodiments from about 70 to about 150 rpm, and in some embodiments, from about 80 to about 120 rpm. The apparent shear rate during melt blending may also range from about 100 seconds$^{-1}$ to about 10,000 seconds$^{-1}$, in some embodiments from about 500 seconds$^{-1}$ to about 5000 seconds$^{-1}$, and in some embodiments, from about 800 seconds$^{-1}$ to about 1200 seconds$^{-1}$. The apparent shear rate is equal to $4Q/\pi R^3$, where Q is the volumetric flow rate ("m$^3$/s") of the polymer melt and R is the radius ("m") of the capillary (e.g., extruder die) through which the melted polymer flows.

Regardless of the particular manner in which it is formed, the resulting polymer composition can possess excellent thermal properties. For example, the melt viscosity of the polymer composition may be low enough so that it can readily flow into the cavity of a mold having small dimensions. In one particular embodiment, the polymer composition may have a melt viscosity of from about 10 to about 250 Pa-s, in some embodiments from about 15 to about 200 Pa-s, in some embodiments from about 20 to about 150 Pa-s, and in some embodiments, from about 30 to about 100 Pa-s, determined at a shear rate of 1,000 seconds$^{-1}$. Melt viscosity may be determined in accordance with ISO Test No. 11443: 2005 at a temperature that is 15° C. higher than the melting temperature of the composition (e.g., about 340° C. for a melting temperature of about 325° C.).

III. Electronic Device

As indicated above, the polymer composition of the present invention is employed in a substrate that is molded onto a "singulated" carrier portion and has conductive traces plated thereon. As used herein, the term "singulated" generally means that the carrier portion has been separated from a larger carrier (e.g., conjoined or continuous). The substrate may be formed using a variety of different techniques. Suitable techniques may include, for instance, injection molding, low-pressure injection molding, extrusion compression molding, gas injection molding, foam injection molding, low-pressure gas injection molding, low-pressure foam injection molding, gas extrusion compression molding, foam extrusion compression molding, extrusion molding, foam extrusion molding, compression molding, foam compression molding, gas compression molding, etc. For example, an injection molding system may be employed that includes a mold within which the polymer composition may be injected. The time inside the injector may be controlled and optimized so that polymer matrix is not pre-solidified. When the cycle time is reached and the barrel is full for discharge, a piston may be used to inject the composition to the mold cavity. Compression molding systems may also be employed. As with injection molding, the shaping of the polymer composition into the desired article also occurs within a mold. The composition may be placed into the compression mold using any known technique, such as by being picked up by an automated robot arm. The temperature of the mold may be maintained at or above the solidification temperature of the polymer matrix for a desired time period to allow for solidification. The molded product may then be solidified by bringing it to a temperature below that of the melting temperature. The resulting product may be de-molded. The cycle time for each molding process may be adjusted to suit the polymer matrix, to achieve sufficient bonding, and to enhance overall process productivity.

Figure 4:
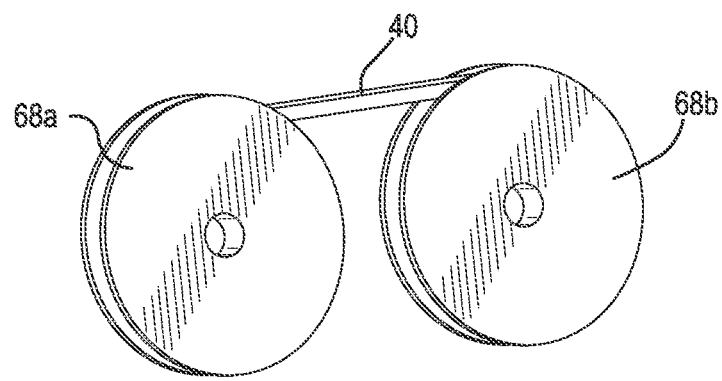
FIG. 4 is a perspective view of one embodiment of a reel-to-reel carrier that may be used in the manufacturing process shown in FIG. 1.

A flow diagram for an embodiment a manufacturing process that can be employed to form the electronic device of the present invention is shown in FIG. 1. As shown in Step 1, a carrier 40 is provided that contains an outer region from which arms 56 extend to form a leadframe 54. As shown in FIG. 4, the carrier 40 may, for example, be unspooled from a bulk source reel 68a and then collected in a second reel 68b. The carrier 40 is typically formed from a metal (e.g., copper or copper alloy) or other suitable conductive material. If desired, the arms 56 may also contain apertures 58 provided therein. Carrier holes 52 may likewise located on the outer portions of the carrier 40 to allow it to traverse along a manufacturing line in a continuous manner. In Step 2, a substrate 42, which may be formed from the polymer composition of the present invention, may thereafter be molded (e.g., overmolded) over the leadframe 54. Apertures 60 may be provided in the substrate 42 that correspond to the apertures 58 in the fingers 56.

Figure 5:
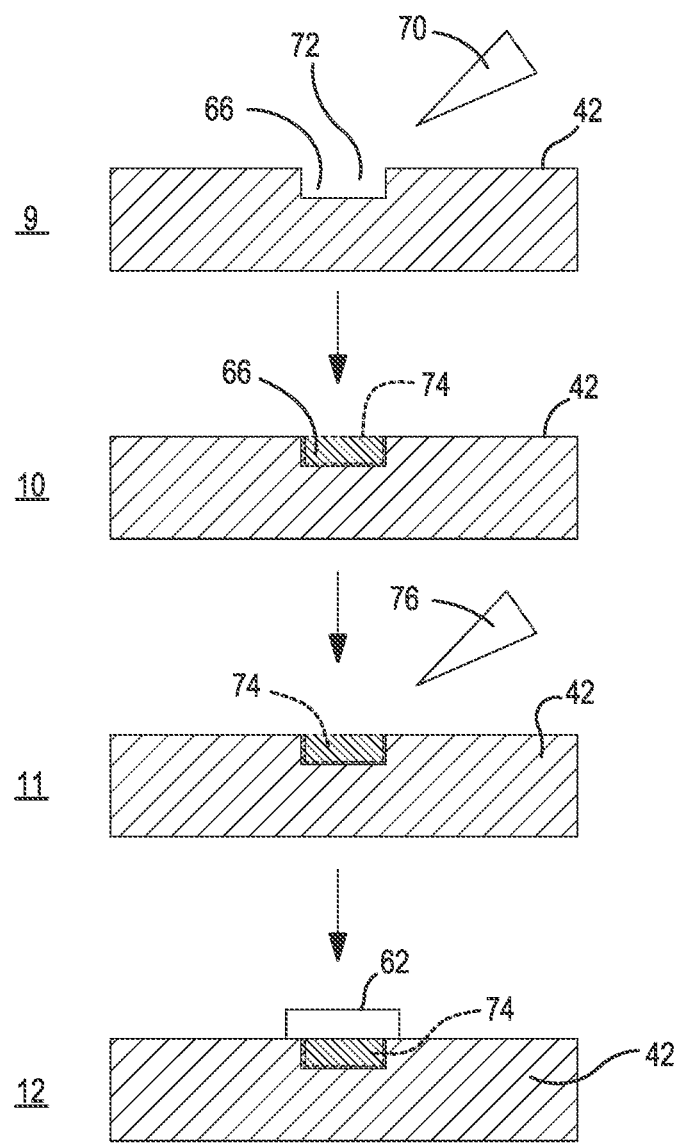
FIG. 5 is a schematic view of one embodiment for forming circuit traces on a substrate.

Once the substrate 42 is molded over the leadframe 54, conductive circuit traces may then be formed. Such traces may be formed through a variety of known metal deposition techniques, such as by plating (e.g., electroplating, electroless plating, etc.), printing (e.g., digital printing, aerosol jet printing, etc.), and so forth. If desired, a seed layer may initially be formed on the substrate to facilitate the metal deposition process. In Steps 3 and 3A of FIG. 1, for instance, a seed layer 44 may initially be deposited on the surface of the substrate 42, which allows an internal bus bar 43 formed by the carrier 40 to be electrically connected to the seed layer 44. The seed layer 44 may then be deposited with a metal (e.g., copper, nickel, gold, silver, tin, lead, palladium, etc.) to form a part 46 containing electronic circuit traces 62 (Step 4). In one embodiment, for instance, electroplating may be performed by applying a voltage potential to the carrier 40 and thereafter placed in an electroplating bath. Vias can also be optionally molded into the surface of the substrate to create an electrical path between the traces and the internal layers of the circuit. These traces create an "electrical bus bar" to the carrier portion, which enables the traces to be plated after the deposited conductive paste is applied. If desired, the surface of the substrate may be roughened prior to being plated using a variety of known techniques, such as laser ablation, plasma etching, ultraviolet light treatment, fluorination, etc. Among other things, such roughening helps facilitating plating in the desired interconnect pattern. Referring to FIG. 5, for example, one embodiment of a process that employs a laser for this purpose is illustrated in more detail. More particularly, as shown in Step 9, a laser 70 may be initially employed to ablate the surface of the substrate 42 to create a channel 72 that forms an interconnect pattern 66. In Step 10, an electrically conductive paste 74 may then be disposed within the channel 72 via any known technique, such as by an inkjet process, aerosol process, or screening process. Alternatively, a plating process (e.g., electroless plating) may also be employed in lieu of and/or in addition to the use of a paste. When employed, however, the deposited paste 74 may optionally be sintered through a laser or flash heat 76 as illustrated in Step 11 to help ensure that the paste 74 sufficiently adheres to the substrate 42. Once optionally sintered, the paste 74 is then plated (e.g., electroplated) as shown in Step 12 to form electronic circuit traces 62.

Figure 2:
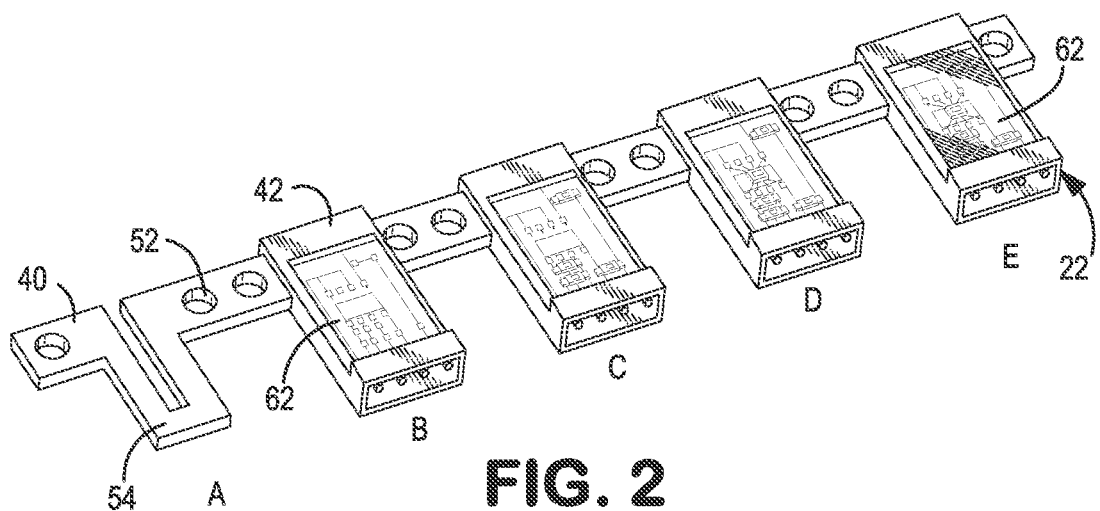
FIG. 2 is a perspective view of the manufacturing process shown in FIG. 1 in which a substrate is shown at various stages on a carrier during formation of the electronic device.
Figure 3:
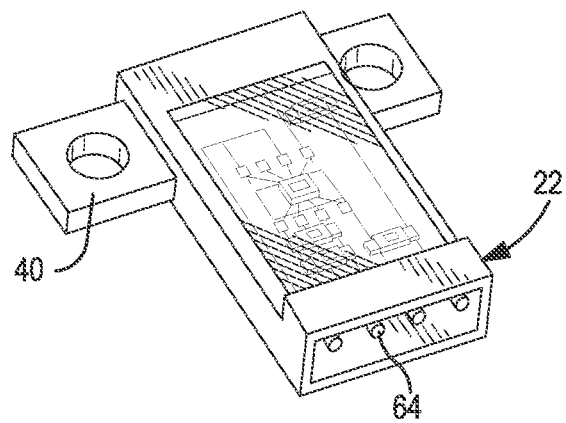
FIG. 3 is a perspective view of the electronic device shown in FIG. 2 after separation from the carrier.

Referring again to FIG. 1, once plated, an electrical device may be formed by connecting one or more electrical components 50 to the substrate 42 (Step 6) using any of a variety of techniques, such as soldering, wire bonding, etc. In certain embodiments, a solder mask 48 may optionally be applied (Step 5) prior to the connection of the components 50. The resulting electronic device may then be separated from the carrier 40. FIGS. 2-3, for instance, illustrate one embodiment of an electronic device 22 during various stages of its formation. At Step A, for instance, the carrier 40 is shown prior to molding. Step B shows the substrate 42 after it has been molded onto the carrier portion 40 and applied with electronic circuit traces 62. At Steps C and D, optional pin contacts and circuit metallization may be added to form the completed electronic device (Step E). The completed electronic device 22 may then be separated from the adjoined carrier 40 as illustrated in FIG. 3 to form an electronic device 22 containing a singulated carrier portion 40. The resulting electronic device may contain various types of electronic components, such as a housing for a light source (e.g., light emitting diode ("LED")) for a light (e.g., a tunnel light, headlamp, etc.), or other electronic equipment, such as used in computers, phones, electronic control units, etc. Such products may be particularly useful in vehicles (e.g., automobiles, buses, motorcycles, boats, etc.), such as an electric vehicle (EV), a hybrid electric vehicle (HEV), a plug-in hybrid electric vehicle (PHEV), or other type of vehicle using electric power for propulsion (collectively referred to as "electric vehicles").

Figure 6:
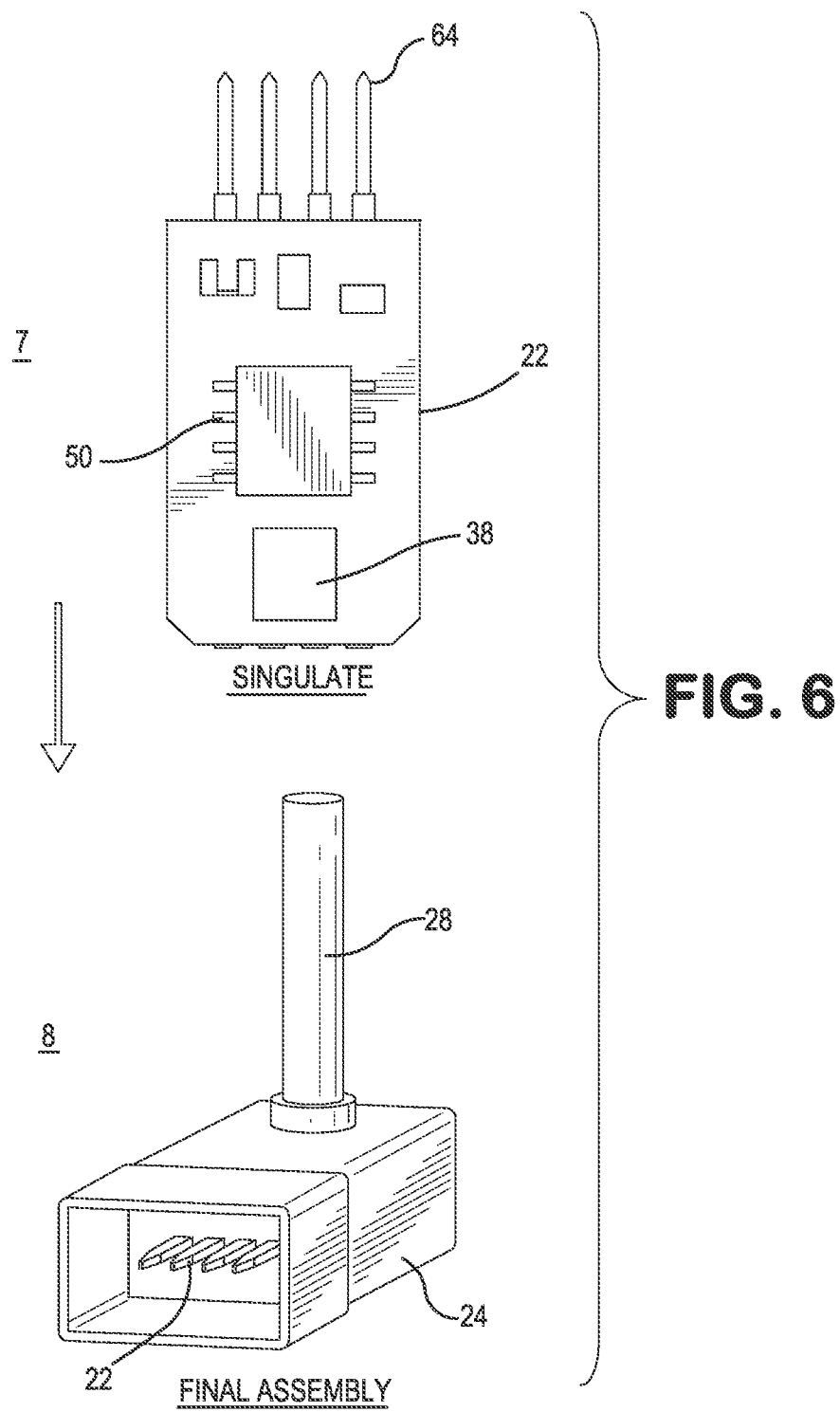
FIG. 6 is a flow diagram that shows additional steps that can be employed in the manufacturing process of FIG. 1.
Figure 7:
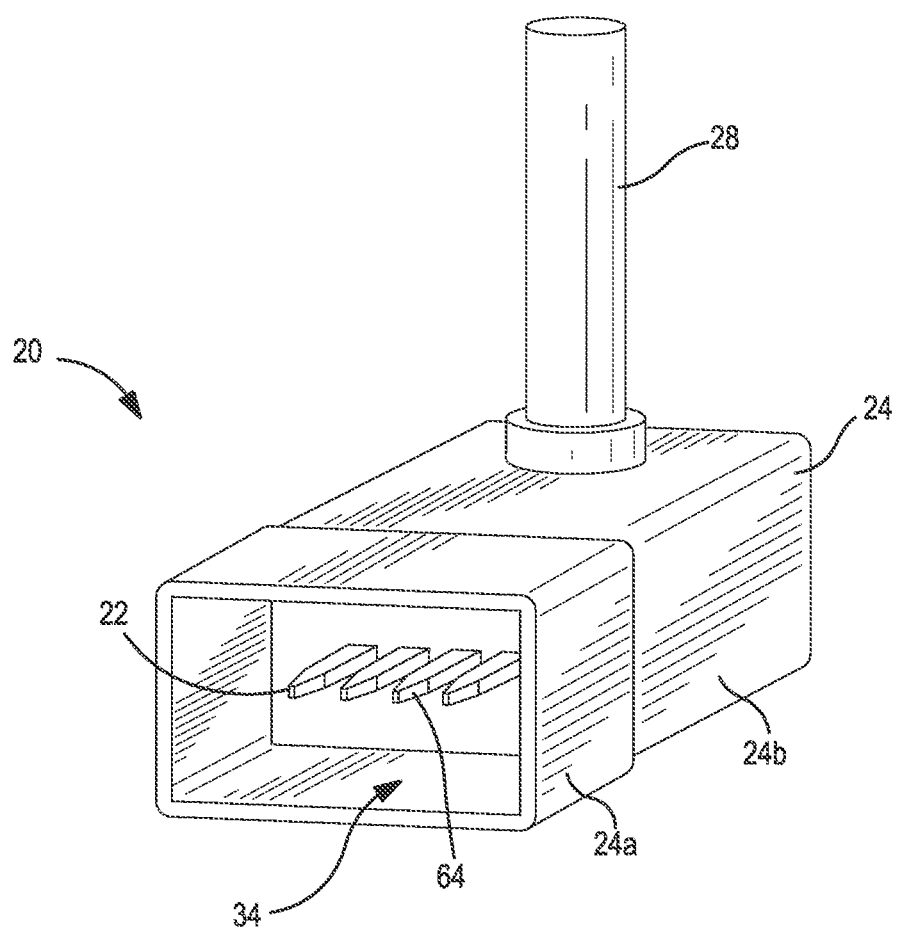
FIG. 7 is a perspective view of one embodiment of the electronic device of the present invention in the form of an automotive light.
Figure 8:
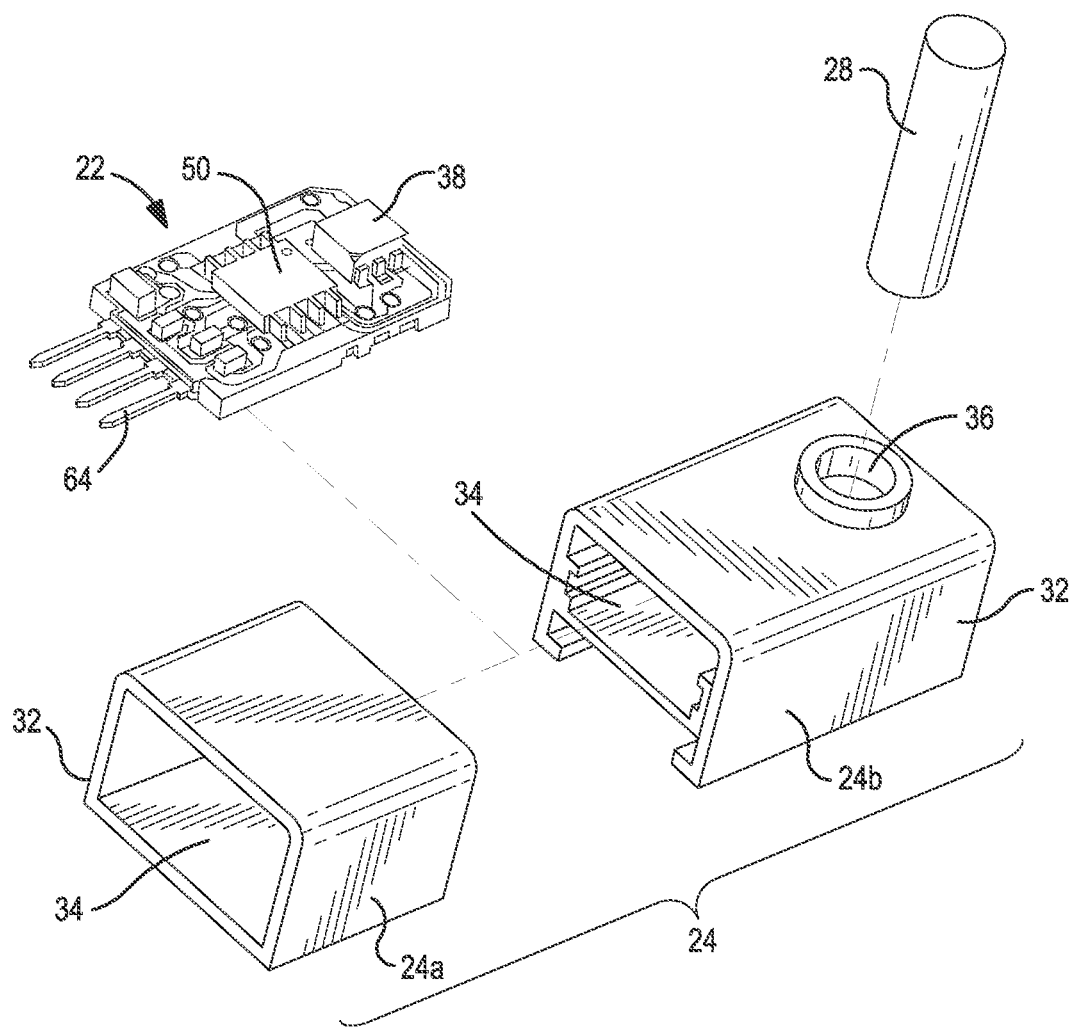
FIG. 8 is an exploded perspective view of the electronic device shown in FIG. 7.

Referring to FIGS. 7-8, for example, one embodiment an electronic product is shown that is in the form of a light 20 for use in automotive products. The light 20 includes a housing 24, an electronic device 22 (see also FIG. 2), and a light pipe 28. The housing 24 may be formed in two parts 24a and 24b as shown in FIG. 8. The housing 24 has a wall 32 forming a passageway 34 therethrough and an aperture 36 that extends through the wall 32 and is in communication with the passageway 34. The aperture 36 may be transverse to the passageway 34. The electronic device 22 may be mounted within the passageway 34 of the housing 30. The light pipe 28 extends through the aperture 36 in the housing 30 and is mounted above a light emitting diode (LED) 38, which is formed as one or more of the electronic components 50 of the electronic device 22 as described herein. FIG. 6 provides a representative process for forming the light 20. Steps 7 and 8, for instance, show that the electronic device 22 is singulated from the other devices and assembled with the housing 24 and light pipe 28. After the device 22 is formed, it is mounted within the passageway 34 and the parts 24a and 24b of the housing 24 are assembled together. The pin contacts 64 remain exposed. The light pipe 28 is mounted through the aperture 36 in the housing 24 and is provided above the LED(s) 38.

The present invention may be better understood with reference to the following examples.

Test Methods

Melt Viscosity: The melt viscosity (Pa-s) may be determined in accordance with ISO Test No. 11443:2014 at a shear rate of 1,000 s$^{-1}$ and temperature 15° C. above the melting temperature using a Dynisco LCR7001 capillary rheometer. The rheometer orifice (die) had a diameter of 1 mm, length of 20 mm, L/D ratio of 20.1, and an entrance angle of 180°. The diameter of the barrel was 9.55 mm+0.005 mm and the length of the rod was 233.4 mm.

Melting Temperature: The melting temperature ("Tm") may be determined by differential scanning calorimetry ("DSC") as is known in the art. The melting temperature is the differential scanning calorimetry (DSC) peak melt temperature as determined by ISO Test No. 11357-2:2018. Under the DSC procedure, samples were heated and cooled at 20° C. per minute as stated in ISO Standard 10350 using DSC measurements conducted on a TA Q2000 Instrument.

Deflection Temperature Under Load ("DTUL"): The deflection under load temperature may be determined in accordance with ISO Test No. 75-2:2013 (technically equivalent to ASTM D648). More particularly, a test strip sample having a length of 80 mm, thickness of 10 mm, and width of 4 mm may be subjected to an edgewise three-point bending test in which the specified load (maximum outer fibers stress) was 1.8 Megapascals. The specimen may be lowered into a silicone oil bath where the temperature is raised at 2° C. per minute until it deflects 0.25 mm (0.32 mm for ISO Test No. 75-2:2013).

Tensile Modulus, Tensile Stress, and Tensile Elongation: Tensile properties may be tested according to ISO Test No. 527:2019 (technically equivalent to ASTM D638). Modulus and strength measurements may be made on the same test strip sample having a length of 80 mm, thickness of 10 mm, and width of 4 mm. The testing temperature may be 23° C., and the testing speeds may be 1 or 5 mm/min.

Flexural Modulus, Flexural Stress, and Flexural Elongation: Flexural properties may be tested according to ISO Test No. 178:2019 (technically equivalent to ASTM D790). This test may be performed on a 64 mm support span. Tests may be run on the center portions of uncut ISO 3167 multi-purpose bars. The testing temperature may be 23° C. and the testing speed may be 2 mm/min.

Unnotched and Notched Charpy Impact Strength: Charpy properties may be tested according to ISO Test No. ISO 179-1:2010) (technically equivalent to ASTM D256-10, Method B). This test may be run using a Type 1 specimen size (length of 80 mm, width of 10 mm, and thickness of 4 mm). When testing the notched impact strength, the notch may be a Type A notch (0.25 mm base radius). Specimens may be cut from the center of a multi-purpose bar using a single tooth milling machine. The testing temperature may be 23° C.

Dielectric Constant ("Dk") and Dissipation Factor ("Df"): The dielectric constant (or relative static permittivity) and dissipation factor are determined using a known split-post dielectric resonator technique, such as described in Baker-Jarvis, et al., *IEEE Trans. on Dielectric and Electrical Insulation,* 5(4), p. 571 (1998) and Krupka, et al., *Proc. 7$^{th}$ International Conference on Dielectric Materials: Measurements and Applications, IEEE Conference Publication No.* 430 (September 1996). More particularly, a plaque sample having a size of 80 mm×90 mm×3 mm was inserted between two fixed dielectric resonators. The resonator measured the permittivity component in the plane of the specimen. Five (5) samples are tested and the average value is recorded. The split-post resonator can be used to make dielectric measurements in the low gigahertz region, such as 1 GHz from 2 GHz.

Heat Cycle Test: Specimens are placed in a temperature control chamber and heated/cooled within a temperature range of from −30° C. and 100° C. Initially, the samples are heated until reaching a temperature of 100° C., when they were immediately cooled. When the temperature reaches −30° C., the specimens are immediately heated again until reaching 100° C. Twenty three (23) heating/cooling cycles may be performed over a 3-hour time period.

Surface/Volume Resistivity: The surface and volume resistivity values may be determined in accordance with IEC 62631-3-1:2016 or ASTM D257-14. According to this procedure, a standard specimen (e.g., 1 meter cube) is placed between two electrodes. A voltage is applied for sixty (60) seconds and the resistance is measured. The surface resistivity is the quotient of the potential gradient (in V/m) and the current per unit of electrode length (in A/m), and generally represents the resistance to leakage current along the surface of an insulating material. Because the four (4) ends of the electrodes define a square, the lengths in the quotient cancel and surface resistivities are reported in ohms, although it is also common to see the more descriptive unit of ohms per square. Volume resistivity is also determined as the ratio of the potential gradient parallel to the current in a material to the current density. In SI units, volume resistivity is numerically equal to the direct-current resistance between opposite faces of a one-meter cube of the material (ohm-m or ohm-cm).

Example 1

Samples 1-4 are formed from various percentages of a liquid crystalline polymer ("LCP 1" and "LCP 2"), wollastonite fibers (Nyglos™ 8), carbon black pigment, carbon fibers, and a lubricant (Glycolube™ P). LCP 1 is formed from 60 mol. % HBA, 5 mol. % HNA, 12 mol. % BP, 17.5 mol. % TA, and 5 mol. % APAP. LCP 2 is formed from 73 mol. % HBA and 27 mol. % HNA. Compounding was performed using an 18-mm single screw extruder. The samples are injection molded into plaques (60 mm×60 mm).

TABLE 1

| Sample | 1 | 2 | 3 | 4 |
|---|---|---|---|---|
| LCP 1 | 37.2 | 47.2 | 57.2 | 62.2 |
| LCP 2 | 21.0 | 14.0 | 7.0 | 3.5 |
| Wollastonite Fibers | 30 | 30 | 30 | 30 |
| Carbon Black Pigment | 2.5 | 2.5 | 2.5 | 2.5 |
| Carbon Fibers | 9.0 | 6.0 | 3.0 | 1.5 |
| Lubricant | 0.3 | 0.3 | 0.3 | 0.3 |

Samples 1-4 were tested for thermal and mechanical properties. The results are set forth below in Table 2.

TABLE 2

| Sample | 1 | 2 | 3 | 4 |
|---|---|---|---|---|
| Surface Resistivity (ohm) | 4.20E+15 | 7.30E+15 | 1.40E+16 | 6.40E+15 |
| Volume Resistivity (ohm-m) | 5.00E+13 | 1.60E+14 | 1.20E+14 | 9.30E+13 |
| Dielectric Constant (2 GHz) | — | — | 13.1 | 12.5 |
| Dissipation Factor (2 GHz) | — | — | 0.0170 | 0.0176 |
| Notched Charpy (kJ/m$^2$) | 7.1 | 6.7 | 7.6 | 8.1 |
| Unnotched Charpy (kJ/m$^2$) | 11 | 18 | 34 | 28 |
| Tensile Strength (MPa) | 124 | 127 | 133 | 134 |
| Tensile Modulus (MPa) | 18,916 | 16,690 | 13,067 | 14,278 |
| Tensile Elongation (%) | 1.29 | 1.5 | 2.12 | 1.9 |
| Flexural Strength (MPa) | 177 | 179 | 166 | 171 |
| Flexural Modulus (MPa) | 18,466 | 16,180 | 13,364 | 14,466 |
| Flexural Elongation (%) | 1.59 | 1.77 | 2.54 | 2.21 |
| Melt Viscosity (Pa-s) at 1,000 s$^{-1}$ | 38.3 | 42.3 | 40.3 | 41.8 |
| Melting Temperature (° C., 1$^{st}$ heat of DSC) | 319.15 | 317.2 | 328.11 | 325.28 |
| DTUL (1.8 MPa, ° C.) | 235 | 231 | 234 | 233 |

Samples 3-4 were also subjected to a heat cycle test as described above. Upon testing, it was determined that the resulting dissipation factor for the samples was 0.021 and 0.015, respectively. Thus, the ratio of the dissipation factor after heat cycle testing to the initial dissipation factor for Samples 3 and 4 was 1.24 and 0.86, respectively. Upon testing, it was also determined that the resulting dielectric constant for the samples was 12.9 and 12.6, respectively. Thus, the ratio of the dielectric constant after heat cycle testing to the initial dielectric constant for Samples 3 and 4 was 0.98 and 1.01, respectively.

Example 2

Samples 5-9 are formed from various percentages of a liquid crystalline polymer ("LCP 1" and "LCP 2"), Nyglos™ 8, carbon black pigment, graphite, and Glycolube™ P. Compounding was performed using an 18-mm single screw extruder. The samples are injection molded into plaques (60 mm×60 mm).

TABLE 3

| Sample | 1 | 2 | 3 | 4 |
|---|---|---|---|---|
| LCP 1 | 37.2 | 47.2 | 57.2 | 62.2 |
| LCP 2 | 22.5 | 15.5 | 7.5 | 3.75 |
| Wollastonite Fibers | 30 | 30 | 30 | 30 |
| Carbon Black Pigment | 2.5 | 2.5 | 2.5 | 2.5 |
| Graphite | 7.5 | 4.5 | 2.5 | 1.25 |
| Lubricant | 0.3 | 0.3 | 0.3 | 0.3 |

Samples 5-9 were tested for thermal and mechanical properties. The results are set forth below in Table 4.

TABLE 4

| Sample | 5 | 6 | 7 | 8 |
|---|---|---|---|---|
| Surface Resistivity (ohm) | 4.10E+16 | 2.80E+17 | 1.40E+16 | 3.50E+16 |
| Volume Resistivity (ohm-m) | 1.10E+14 | 3.50E+14 | 2.30E+14 | 7.80E+13 |
| Dielectric Constant (2 GHz) | 12.6 | 8.8 | 6.3 | — |
| Dissipation Factor (2 GHz) | 0.0492 | 0.0201 | 0.009 | — |
| Notched Charpy (kJ/m$^2$) | 4.3 | 5.3 | 7.8 | 12.6 |
| Unnotched Charpy (kJ/m$^2$) | 26 | 30 | 43 | 50 |
| Tensile Strength (MPa) | 109 | 132 | 139 | 130 |
| Tensile Modulus (MPa) | 13491 | 14737 | 14562 | 14229 |
| Tensile Elongation (%) | 1.53 | 1.68 | 1.96 | 1.79 |
| Flexural Strength (MPa) | 144 | 167 | 177 | 176 |
| Flexural Modulus (MPa) | 13689 | 13858 | 14259 | 14091 |
| Flexural Elongation (%) | 1.7 | 2.4 | 2.54 | 2.47 |
| Melt Viscosity (Pa-s) at 1,000 s$^{-1}$ | 46.7 | 45.5 | 43.5 | 39.4 |
| Melting Temperature (° C., 1$^{st}$ heat of DSC) | 329.28 | 327.96 | 330.63 | 329.94 |
| DTUL (1.8 MPa, ° C.) | 221 | 228 | 234 | 239 |

Samples 5-7 were also subjected to a heat cycle test as described above. Upon testing, it was determined that the resulting dissipation factor for the samples was 0.0578, 0.0214, and 0.0098, respectively. Thus, the ratio of the dissipation factor after heat cycle testing to the initial dissipation factor for Samples 5, 6, and 7 was 1.17, 1.06, and 1.09, respectively. Upon testing, it was also determined that the resulting dielectric constant for the samples was 12.6, 8.9, and 6.3, respectively. Thus, the ratio of the dielectric constant after heat cycle testing to the initial dielectric constant for Samples 5, 6, and 7 was 1.0, 1.0, and, 1.0, respectively.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An electronic device comprising:
   a singulated carrier portion;
   a substrate molded onto the singulated carrier portion, wherein the substrate comprises a polymer composition that includes an aromatic polymer, an electrically conductive filler, and a mineral filler, wherein the mineral filler is present in the polymer composition in an amount of from about 10 to about 80 parts by weight per 100 parts by weight of the polymer matrix, wherein the polymer composition exhibits a surface resistivity of from about $1 \times 10^{12}$ ohms to about $1 \times 10^{18}$ ohms as determined in accordance with ASTM D257-14; and conductive traces disposed on the substrate.

2. The electronic device of claim 1, wherein the polymer composition exhibits a volume resistivity of $1 \times 10^{10}$ ohm-m to about $1 \times 10^{16}$ ohm-m as determined in accordance with ASTM D257-14.

3. The electronic device of claim 1, wherein the polymer matrix constitutes from about 30 wt. % to about 80 wt. % of the polymer composition.

4. The electronic device of claim 1, wherein the aromatic polymer has a melting temperature of about 200° C. or more.

5. The electronic device of claim 1, wherein the aromatic polymer is a polyamide, polyester, polyarylene sulfide, polycarbonate, polyphenylene oxide, polyetherimide, liquid crystalline polymer, or a combination thereof.

6. The electronic device of claim 1, wherein the aromatic polymer comprises a liquid crystalline polymer.

7. The electronic device of claim 6, wherein the liquid crystalline polymer contains one or more repeating units derived from an aromatic hydroxycarboxylic acid, wherein the hydroxycarboxylic acid repeating units constitute about 40 mol. % or more of the polymer.

8. The electronic device of claim 7, wherein the liquid crystalline polymer contains repeating units derived from 4-hydroxybenzoic acid, 6-hydroxy-2-naphthoic acid, or a combination thereof.

9. The electronic device of claim 7, wherein the liquid crystalline polymer contains repeating units derived from 4-hydroxybenzoic acid in an amount of from about 30 mol. % to about 90 mol. % of the polymer and contains repeating units derived from 6-hydroxy-2-naphthoic acid in amount of from about 1 mol. % to about 30 mol. % of the polymer.

10. The electronic device of claim 7, wherein the liquid crystalline polymer further contains repeating units derived from terephthalic acid, isophthalic acid, 2,6-naphthalenedicarboxylic acid, hydroquinone, 4,4'-biphenol, acetaminophen, 4-aminophenol, or a combination thereof.

11. The electronic device of claim 1, wherein the electrically conductive filler includes a carbon material.

12. The electronic device of claim 11, wherein the carbon material has a volume resistivity of less than about 0.1 ohm-cm.

13. The electronic device of claim 11, wherein the carbon material includes graphite, carbon black, carbon fibers, graphene, carbon nanotubes, or a combination thereof.

14. The electronic device of claim 1, wherein the electrically conductive filler is present in the polymer composition in an amount of from about 0.5 to about 20 parts by weight per 100 parts by weight of the polymer matrix.

15. The electronic device of claim 1, wherein the weight ratio of the mineral filler to the electrically conductive filler ranges from about 2 to about 500.

16. The electronic device of claim 1, wherein the mineral particles include talc, mica, or a combination thereof.

17. The electronic device of claim 16, wherein the mineral particles include talc, mica, or a combination thereof.

18. The electronic device of claim 16, wherein the mineral fibers include wollastonite.

19. The electronic device of claim 16, wherein the mineral fibers have a median diameter of from about 1 to about 35 micrometers.

20. The electronic device of claim 16, wherein the mineral fibers have an aspect ratio of from about 1 to about 50.

21. The electronic device of claim 1, wherein the polymer composition has a melt viscosity of from about 10 to about 250 Pa-s, as determined in accordance with ISO Test No. 11443:2014 at a shear rate of 1,000 $s^{-1}$ and temperature that is 15° C. above the melting temperature of the composition.

22. The electronic device of claim 1, wherein the singulated carrier portion comprises a metal.

23. The electronic device of claim 1, wherein the substrate contains a channel within which a seed layer is disposed, and further wherein the circuit traces are disposed on the seed layer.

24. The electronic device of claim 23, wherein the channel is formed by a laser.

25. The electronic device of claim 1, wherein the polymer composition exhibits a dielectric constant of about 4 or more and a dissipation factor of about 0.3 or less, as determined at a frequency of 2 GHz.

26. The electronic device of claim 25, wherein the composition exhibits a dielectric constant after being exposed to a temperature cycle of from about −30° C. to about 100° C., wherein the ratio of the dielectric constant after the temperature cycle to the dielectric constant prior to the heat cycle is about 0.8 or more.

27. The electronic device of claim 25, wherein the composition exhibits a dissipation factor after being exposed to a temperature cycle of from about −30° C. to about 100° C., wherein the ratio of the dissipation factor after the temperature cycle to the dissipation factor prior to the heat cycle is about 1.3 or less.

28. The polymer composition of claim 1, wherein the polymer composition is free of spinel crystals.

* * * * *